United States Patent
Otake et al.

(10) Patent No.: US 10,546,898 B2
(45) Date of Patent: Jan. 28, 2020

(54) IMAGING APPARATUS AND ELECTRONIC DEVICE

(71) Applicant: SONY CORPORATION, Tokyo (JP)

(72) Inventors: Yusuke Otake, Kanagawa (JP); Toshifumi Wakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 46 days.

(21) Appl. No.: 16/062,556

(22) PCT Filed: Dec. 9, 2016

(86) PCT No.: PCT/JP2016/086659
§ 371 (c)(1),
(2) Date: Jun. 14, 2018

(87) PCT Pub. No.: WO2017/110515
PCT Pub. Date: Jun. 29, 2017

(65) Prior Publication Data
US 2018/0374903 A1    Dec. 27, 2018

(30) Foreign Application Priority Data
Dec. 24, 2015 (JP) .................................. 2015-251582

(51) Int. Cl.
*H01L 27/00* (2006.01)
*H01L 27/30* (2006.01)
(Continued)

(52) U.S. Cl.
CPC .......... *H01L 27/307* (2013.01); *H01L 27/281* (2013.01); *H01L 27/286* (2013.01); *H01L 51/442* (2013.01)

(58) Field of Classification Search
CPC ... H01L 27/307; H01L 27/286; H01L 27/281; H01L 51/442
See application file for complete search history.

(56) References Cited

U.S. PATENT DOCUMENTS 5,418,387 A * 5/1995 Nakamura ........ H01L 27/14831
257/222
2006/0214166 A1* 9/2006 Suzuki ................ H01L 27/1462
257/59

(Continued)

FOREIGN PATENT DOCUMENTS

JP    H 06204450    7/1994
JP    2006-049873   2/2006

(Continued)

OTHER PUBLICATIONS

International Search Report prepared by the Japan Patent Office on Jan. 19, 2017, for International Application No. PCT/JP2016/086659.

*Primary Examiner* — Reema Patel
(74) *Attorney, Agent, or Firm* — Sheridan Ross P.C.

(57) ABSTRACT

This technology relates to an imaging apparatus and an electronic device structured to perform pupil correction appropriately. There are provided a photoelectric conversion film configured to absorb light of a predetermined color component to generate signal charges, a first lower electrode configured to be formed under the photoelectric conversion film, a second lower electrode configured to be connected with the first lower electrode, a via configured to connect the first lower electrode with the second lower electrode, and a photodiode configured to be formed under the second lower electrode and to generate signal charges reflecting the amount of incident light. A first distance between the center of the photodiode and the center of the via at the center of the angle of view is different from a second distance therebetween at an edge of the angle of view. The present technology can be applied to imaging apparatuses.

17 Claims, 23 Drawing Sheets

(51) Int. Cl.
*H01L 27/28* (2006.01)
*H01L 51/44* (2006.01)

(56) References Cited

U.S. PATENT DOCUMENTS

| | | | | |
|---|---|---|---|---|
| 2007/0291144 | A1* | 12/2007 | Suzuki | H01L 27/14621 |
| | | | | 348/272 |
| 2009/0046185 | A1* | 2/2009 | Ota | H04N 5/23232 |
| | | | | 348/294 |
| 2013/0057699 | A1* | 3/2013 | Ooki | H01L 27/14621 |
| | | | | 348/164 |
| 2013/0182173 | A1* | 7/2013 | Murata | H01L 27/14605 |
| | | | | 348/349 |
| 2015/0171146 | A1 | 6/2015 | Ooki | |
| 2015/0187843 | A1 | 7/2015 | Hatano | |
| 2016/0219233 | A1 | 7/2016 | Murata | |

FOREIGN PATENT DOCUMENTS

| | | |
|---|---|---|
| JP | 2006-269923 | 10/2006 |
| JP | 2007-336282 | 12/2007 |
| JP | 2009-027063 | 2/2009 |
| JP | 2009-049524 | 3/2009 |
| JP | 2011-100894 | 5/2011 |
| JP | 2013-070030 | 4/2013 |
| JP | 2013-145292 | 7/2013 |
| WO | WO 2012/169127 | 12/2012 |
| WO | WO 2014/027588 | 2/2014 |
| WO | WO 2016/117381 | 7/2016 |

* cited by examiner

IMAGING APPARATUS AND ELECTRONIC DEVICE

CROSS REFERENCE TO RELATED APPLICATIONS

This application is a national stage application under 35 U.S.C. 371 and claims the benefit of PCT Application No. PCT/JP2016/086659 having an international filing date of 9 Dec. 2016, which designated the United States, which PCT application claimed the benefit of Japanese Patent Application No. 2015-251582 filed 24 Dec. 2015, the entire disclosures of each of which are incorporated herein by reference.

TECHNICAL FIELD

The present technology relates to an imaging apparatus and an electronic device. More particularly, the technology relates to an imaging apparatus and electronic device capable of achieving higher sensitivity and higher resolution through effective pupil correction.

BACKGROUND ART

Imaging elements such as CCD image sensors and CMOS image sensors have respective color filters of red (R), green (G), and blue (B) arranged in mosaic fashion over an array of photoelectric conversion pixels (photodiodes). In this structure, color signals are output from the respective pixels of the color imaging elements in a manner reflecting their color filters and then signal processed so as to generate color images.

However, in the case where the imaging elements have their primary color (R, G, and B) filters arranged in mosaic fashion, two-thirds of incident light are absorbed by the respective color filters. This leads to poor utilization of light resulting in reduced sensitivity. Also, resolution is poor because only a single-color signal is obtained from each pixel. In particular, there is a possibility that false colors will become conspicuous.

PTLs 1 and 2 propose an imaging element in which three photoelectric conversion films are stacked one on top of the other. The imaging element has, for example, a pixel structure in which the three photoelectric conversion films stacked one on top of the other generate signal charges (electrons, positive holes) corresponding to the light of the blue (B), green (G), and red (R) colors, in that order, past a light incident surface. Each pixel is equipped with signal readout circuits that independently read the signal charges photo-generated by each photoelectric conversion film. In the case of this imaging element, the utilization of visible light is highly efficient because almost all incident light is photoelectrically converted. The literature proposes that images of high resolution are obtained with high sensitivity and with few conspicuous false colors thanks to the structure in which the three color signals of R, G and B are acquired from each pixel.

CITATION LIST

Patent Literature

[PTL 1]
  JP-T-2002-502120
[PTL 2]
  JP 2002-83946A
[PTL 3]
  JP 2006-269923A

SUMMARY

Technical Problem

With the imaging element in which the three photoelectric conversion films are stacked one on top of the other (stacked sensor) as proposed by PTLs 1 and 2, there is a difference in height between a light reception section and the photoelectric conversion films inside a silicon substrate. For this reason, in a case where light enters obliquely in the periphery of the angle of view, there is a possibility that the sensitivity of the photoelectric conversion films can deteriorate.

PTL 3 proposes that the electrodes positioned under the photoelectric conversion films be formed in a manner shifted from the light reception section of the silicon substrate so as to reduce the drop in sensitivity for oblique incident light in the periphery of the angle of view. However, in a case where the amount of pupil correction is large, there is a possibility that the lower electrodes of the photoelectric conversion films in particular may protrude from the unit pixels in the silicon substrate. In that case, with the readout circuits of the photoelectric conversion films arranged inside the unit pixels of the silicon substrate, the potential of the photoelectric conversion films cannot be conveyed into the silicon unit pixels. This restricts the amount of pupil correction.

Also, there is a demand for the stacked sensors to perform suitable pupil correction in order to achieve higher image quality.

The present technology has been devised in view of the above circumstances. An object of the technology is to carry out pupil correction properly and improve image quality.

Solution to Problem

According to one aspect of the present technology, there is provided an imaging apparatus including: a photoelectric conversion film configured to absorb light of a predetermined color component to generate signal charges; a first lower electrode configured to be formed under the photoelectric conversion film; a second lower electrode configured to be connected with the first lower electrode; a via configured to connect the first lower electrode with the second lower electrode; and a photodiode configured to be formed under the second lower electrode and to generate signal charges reflecting the amount of incident light. A first distance between the center of the photodiode and the center of the via at the center of the angle of view is different from a second distance therebetween at an edge of the angle of view.

Also according to one aspect of the present technology, there is provided an electronic device including an imaging apparatus that includes: a photoelectric conversion film configured to absorb light of a predetermined color component to generate signal charges; a first lower electrode configured to be formed under the photoelectric conversion film; a second lower electrode configured to be connected with the first lower electrode; a via configured to connect the first lower electrode with the second lower electrode; and a photodiode configured to be formed under the second lower electrode and to generate signal charges of a second color component reflecting the amount of incident light. A first distance between the center of the photodiode and the center of the via at the center of the angle of view is different from a second distance therebetween at an edge of the angle of view.

The imaging apparatus according to one aspect of the present technology thus includes: a photoelectric conversion film configured to absorb light of a predetermined color component to generate signal charges; a first lower electrode configured to be formed under the photoelectric conversion film; a second lower electrode configured to be connected with the first lower electrode; a via configured to connect the first lower electrode with the second lower electrode; and a photodiode configured to be formed under the second lower electrode and to generate signal charges reflecting the amount of incident light. Further, a first distance between the center of the photodiode and the center of the via at the center of the angle of view is different from a second distance therebetween at an edge of the angle of view.

The electronic device according to one aspect of the present technology thus includes the above-outlined imaging apparatus.

Advantageous Effects of Invention

According to one aspect of the present technology, suitable pupil correction is carried out, so that image quality is improved.

Note that the advantageous effects outlined above are not limitative of the present disclosure. Further advantages of the disclosure will become apparent from the ensuing description.

DESCRIPTION OF EMBODIMENTS

Figure 1:
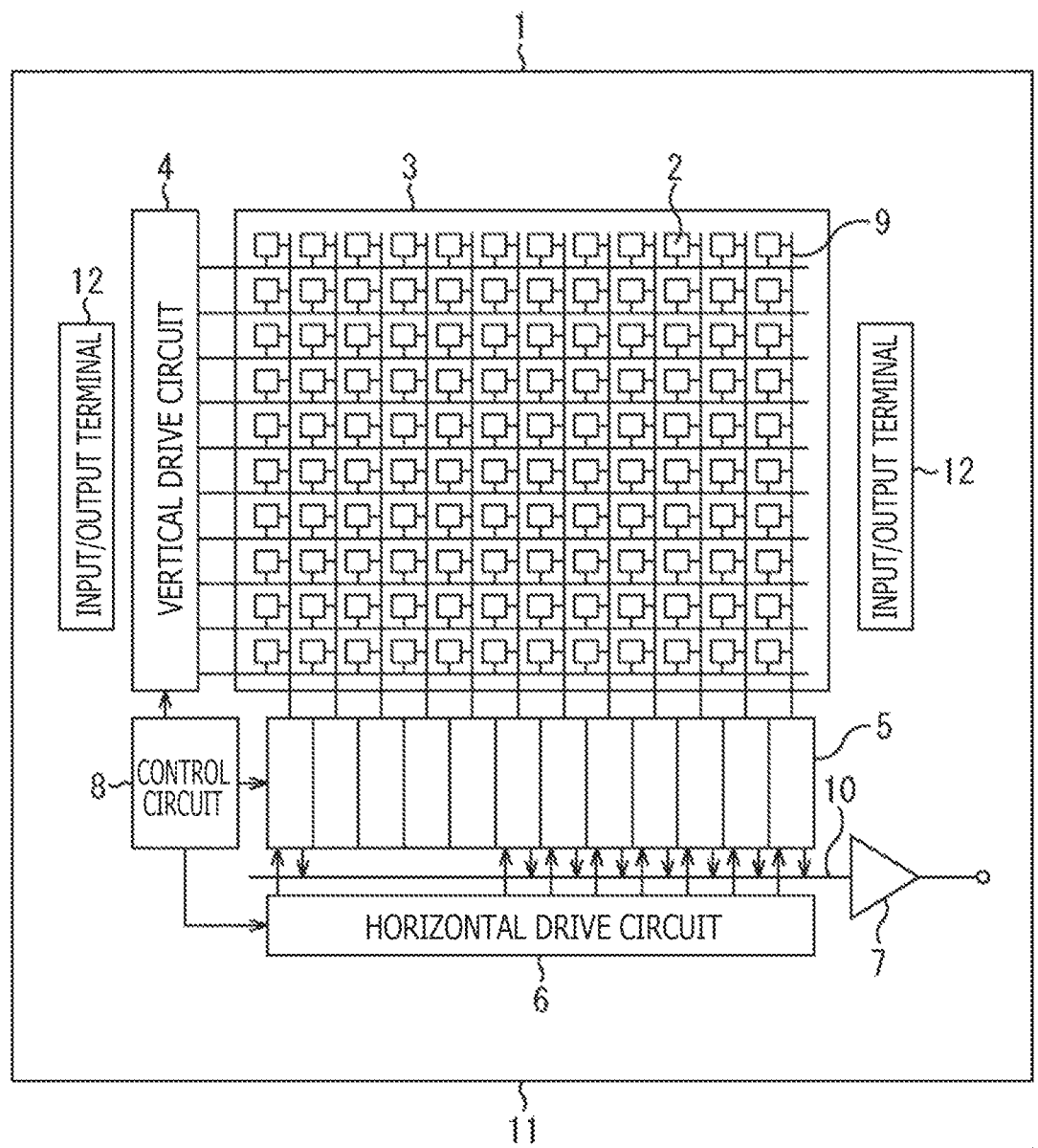
FIG. 1 is an explanatory diagram explaining a structure of an imaging apparatus.

Described below are the preferred modes for implementing the present technology (called the embodiments hereunder). Note that the description will be given under the following headings:

1. Structure of the imaging apparatus
2. Structure of the first imaging element
3. Structure of the second imaging element
4. Structure of the third imaging element
5. Imaging elements subject to pupil correction
6. Size of the second lower electrode
7. Second lower electrode for improving sensitivity
8. Amount of shift of vias
9. Application to phase difference pixels
10. Other positions where color filters are arranged
11. Arrangement of through-hole electrodes
12. Examples of application to front-illuminated apparatus
13. Structures of camera modules
14. Structure of the electronic device
15. Use examples of the imaging apparatus Structure of the Imaging Apparatus FIG. 1 depicts a typical structure of a CMOS imaging apparatus used in one embodiment of the present technology. As depicted in FIG. 1, the imaging apparatus 1 of this example includes a semiconductor substrate 11, a pixel section (so-called imaging region) 3 where multiple pixels 2 including photoelectric conversion sections are arranged in a regular two-dimensional manner over a silicon substrate for example, and a peripheral circuit section. Each pixel 2 has a photoelectric conversion section and multiple pixel transistors (so-called MOS transistors).

The multiple pixel transistors may be constituted by three transistors, such as a transfer transistor, a reset transistor, and an amplification transistor. Alternatively, these three transistors plus one selection transistor may make up the multiple transistors. An equivalent circuit to the unit pixel is similar to the ordinary one and thus will not be explained further. Also, the pixels may use what is known as a multi-pixel sharing structure where multiple photoelectric conversion sections share a floating diffusion section as well as the pixel transistors except for the transfer transistor.

The peripheral circuit section includes a vertical drive circuit 4, column signal processing circuits 5, a horizontal drive circuit 6, an output circuit 7, and a control circuit 8, for example.

The control circuit 8 receives an input clock signal and data that commands operation mode, for example, and further outputs data such as internal information associated with the imaging apparatus. That is, the control circuit 8 generates control signals as well as a clock signal referenced by the vertical drive circuit 4, column signal processing circuits 5, and horizontal drive circuit 6 in operation, among others, on the basis of a vertical synchronizing signal, a horizontal synchronizing signal, and a master clock signal. The control circuit 8 inputs these signals to the vertical drive circuit 4, column signal processing circuits 5, and horizontal drive circuit 6, for example.

The vertical drive circuit 4 is structured using shift registers for example. The vertical drive circuit 4 supplies pulses to select pixel drive wires and to drive the pixels with the selected pixel drive wires, thereby driving the pixels in units of rows. That is, the vertical drive circuit 4 selectively scans the respective pixels 2 in the pixel region 3 successively in units of rows in the vertical direction. The vertical drive circuit 4 thus supplies the column signal processing circuits 5, through vertical signal lines 9, with pixel signals based on the signal charges generated in a manner corresponding to the amount of light received, for example, by a photodiode acting as a photoelectric conversion element of each pixel 2.

The column signal processing circuits 5, arranged one for each column of pixels 2 for example, perform signal processing such as noise reduction on a pixel row to pixel row basis on the signals output from the pixels 2 of each row. That is, the column signal processing circuits 5 carry out signal processing such as CDS for eliminating fixed-pattern noise specific to the pixels 2, signal amplification, and AD conversion. Horizontal selection switches (not illustrated) are connected interposingly between a horizontal signal line 10 and the output stage of the column signal processing circuits 5.

The horizontal drive circuit 6 is structured using shift registers, for example. The horizontal drive circuit 6 successively outputs horizontal scan pulses to select each of the column signal processing circuits 5 in turns, causing the individual column signal processing circuits 5 to output pixel signals onto the horizontal signal line 10.

The output circuit 7 processes the signals supplied successively through the horizontal signal line 10 from the individual column signal processing circuits 5, and outputs the processed signals. In some cases, the signal processing may involve only buffering, for example. In other cases, the signal processing may include black level adjustment, column variation correction, and diverse digital signal processing. Input/output terminals 12 exchange signals with the outside.

Structure of the First Imaging Element

The present technology to be explained below can be applied to the imaging elements each depicted in FIGS. 2, 3, and 4. Explained first are the imaging elements to which the present technology is applied. Also, the imaging elements to which the present technology is applied are those that include photoelectric conversion films and can serve as image sensors such as stacked sensors.

Figure 2:
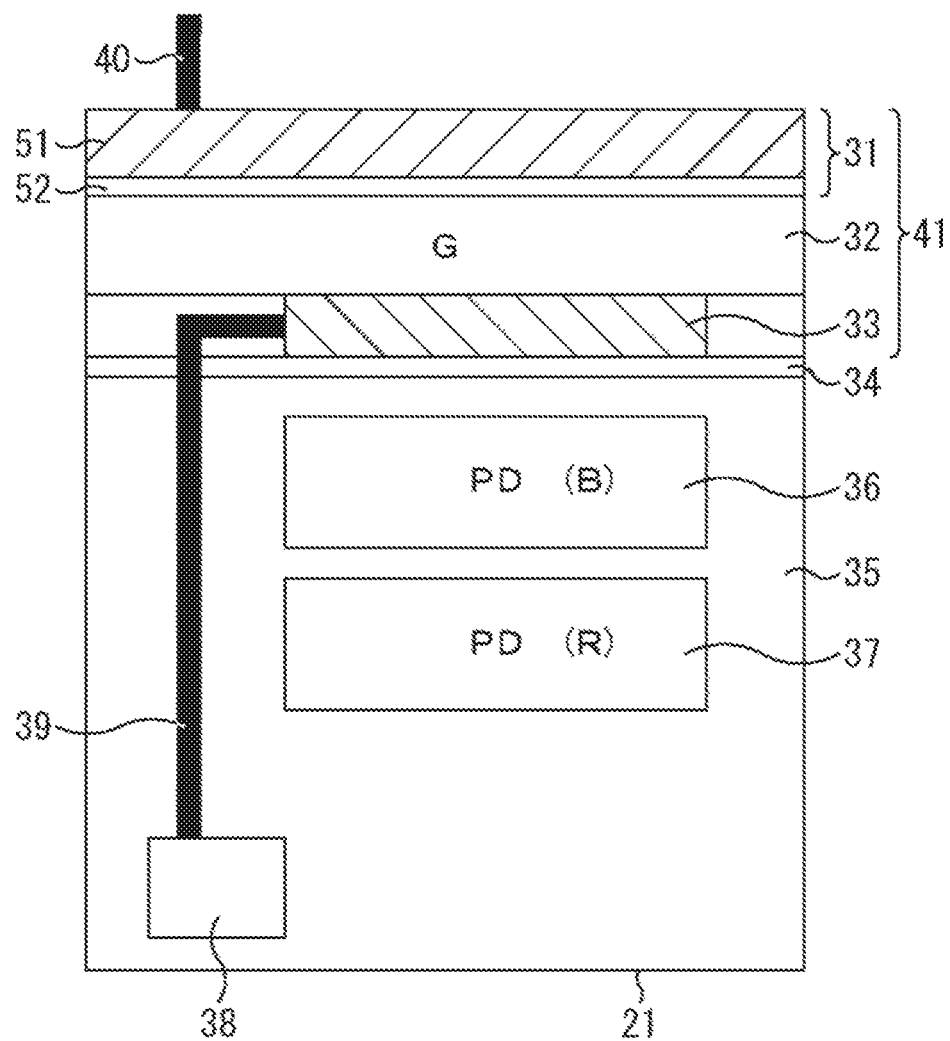
FIG. 2 is an explanatory diagram explaining a structure of a first imaging element.

The imaging element depicted in FIG. 2 is a CMOS imaging element. The drawing is a cross-sectional view of one pixel 2 in the pixel section 3 (FIG. 1).

The pixel 2 includes one organic photoelectric conversion film 41 stacked in the depth direction inside the same pixel, i.e., in each pixel, and two inorganic photoelectric conversion sections PD36 and PD37 (photodiodes) having two pn junctions.

More specifically, the pixel 2 has a semiconductor substrate (silicon substrate) 35 in which the inorganic photoelectric conversion section is formed. A light reception surface on which light is incident is formed on the back side of the substrate 35 (upper side of the substrate 35 as viewed in the drawing). Circuits including readout circuits are formed on the front side of the substrate 35. That is, the pixel 2 has the light reception surface on the back side of the substrate 35 and the circuit formation surface on the front side opposite to the light reception surface. The semiconductor substrate 35 is structured as a semiconductor substrate of the first conductivity type such as an n-type semiconductor substrate.

Formed inside the semiconductor substrate 35 are the inorganic photoelectric conversion sections having two pn junctions, i.e., the first photodiode PD36 and the second photodiode PD37, stacked in the depth direction away from the back side. In the semiconductor substrate 35, the first photodiode PD36 and the second photodiode PD37 are formed away from the back side in the depth direction (downward in the drawing).

In this example, the first photodiode PD36 is used for the color blue (B) and the second photodiode PD37 for the color red (R).

Meanwhile, the organic photoelectric conversion film 41 for a first color is formed over the back side of the substrate where the first and the second photodiodes PD36 and PD37 are formed, the organic photoelectric conversion film 41 being structured with an organic photoelectric conversion film 32 sandwiched by an upper electrode 31 and a lower electrode 33 from above and below. In this example, the organic photoelectric conversion film 36 is used for the color green (G). The upper electrode 31 and the lower electrode 33 are each formed using a transparent conductive film such as an indium tin oxide film or an indium zinc oxide film.

The explanation hereunder proceeds on the assumption that the upper electrode 31 is formed using an oxide semiconductor (ITO) 51 and an aluminum oxide (AlO) film 52. It is also assumed for the ensuing explanation that the lower electrode 33 is an oxide semiconductor (ITO).

As the color combination of this example, the organic photoelectric conversion film 41 is used for the color green, the first photodiode PD36 for the color blue, and the second photodiode PD37 for the color red. Alternatively, some other color combination is available. For example, the organic photoelectric conversion film 41 may be used for the color red or blue, and the first photodiode PD36 and the second photodiode PD37 may be used for the other colors. In this case, the positions of the first and the second photodiodes PD36 and PD37 are set in the depth direction depending on the colors they are used for.

As the organic photoelectric conversion film that performs photoelectric conversion on the green wavelength light, organic photoelectric conversion materials including, for example, rhodamine-based dyes, merocyanine-based dyes, and quinacridone may be used. As the organic photoelectric conversion film that performs photoelectric conversion on the red wavelength light, organic photoelectric conversion materials including phthalocyanine-based dyes may be used. As the organic photoelectric conversion film that performs photoelectric conversion on the blue wavelength light, organic photoelectric conversion materials including coumarin-based dyes, tris (8-hydroxyquinolinato) aluminum Al (Alq3), and merocyanine-based dyes may be used.

In the organic photoelectric conversion film 41, the transparent lower electrode 33 is formed, along with an insulating film 34 formed to isolate the lower electrode 33 dielectrically. The lower electrode 33 is covered with the organic photoelectric conversion film 32 that in turn is covered with the transparent upper electrode 31.

In each pixel 20, the semiconductor substrate 35 is provided with a pair of wires 39 and 40. The lower electrode 33 of the organic photoelectric conversion film 41 is connected with the wire 39. The upper electrode 31 is connected with the wire 40.

In order to suppress short-circuits with Si, for example, the wires 39 and 40 may be formed using a tungsten (W) plug having an SiO2 or SiN insulating layer in its periphery or an ion-injected semiconductor layer. Because the signal charges are electrons in this example, the wire 39 constitutes an n-type semiconductor layer in the case of formation by ion injection. The upper electrode may be of p-type to permit hole extraction.

In this example, an n-type region 38 for charge storage is formed on the front side of the substrate 35. The n-type region 38 functions as a floating diffusion section of the organic photoelectric conversion film 41.

As the insulating film 34 on the back side of the semiconductor substrate 35, a film having negative fixed charges may be used. For example, a hafnium oxide film may be used as the film having negative fixed charges. That is, the insulating film 34 may be formed in a three-layer structure in which a silicon oxide film, a hafnium oxide film, and a silicon oxide film are stacked one on top of the other in that order away from the back side.

On the circuit formation surface on the front side of the substrate 35, multiple pixel transistors are formed in a manner corresponding to the organic photoelectric conversion film 36, the first photodiode PD36, and the second photodiode PD37, individually. The multiple pixel transistors may be formed in the above-mentioned four-transistor structure or three-transistor structure. Alternatively, it is possible to adopt a structure in which the pixel transistors are shared. These transistors are not depicted in FIG. 2.

It is to be noted that, although not depicted, peripheral circuits such as logic circuits are formed in the peripheral circuit section, along with the pixel transistors of the pixel section formed on the front side of the semiconductor substrate 35. The layer that includes the peripheral circuits is referred to as the multilayer wiring layer hereunder. The multilayer wiring layer, not depicted in FIG. 2, is provided on the underside of the substrate 35 in the drawing.

The back side of the semiconductor substrate 35, or more particularly the surface of the upper electrode 31 of the organic photoelectric conversion film 41, serves as the light reception surface. Also, on-chip lenses (not depicted) are formed over the organic photoelectric conversion film 41 with a flattening film (not depicted) interposed therebetween. No color filter is formed in this example.

Structure of the Second Imaging Element

Figure 3:
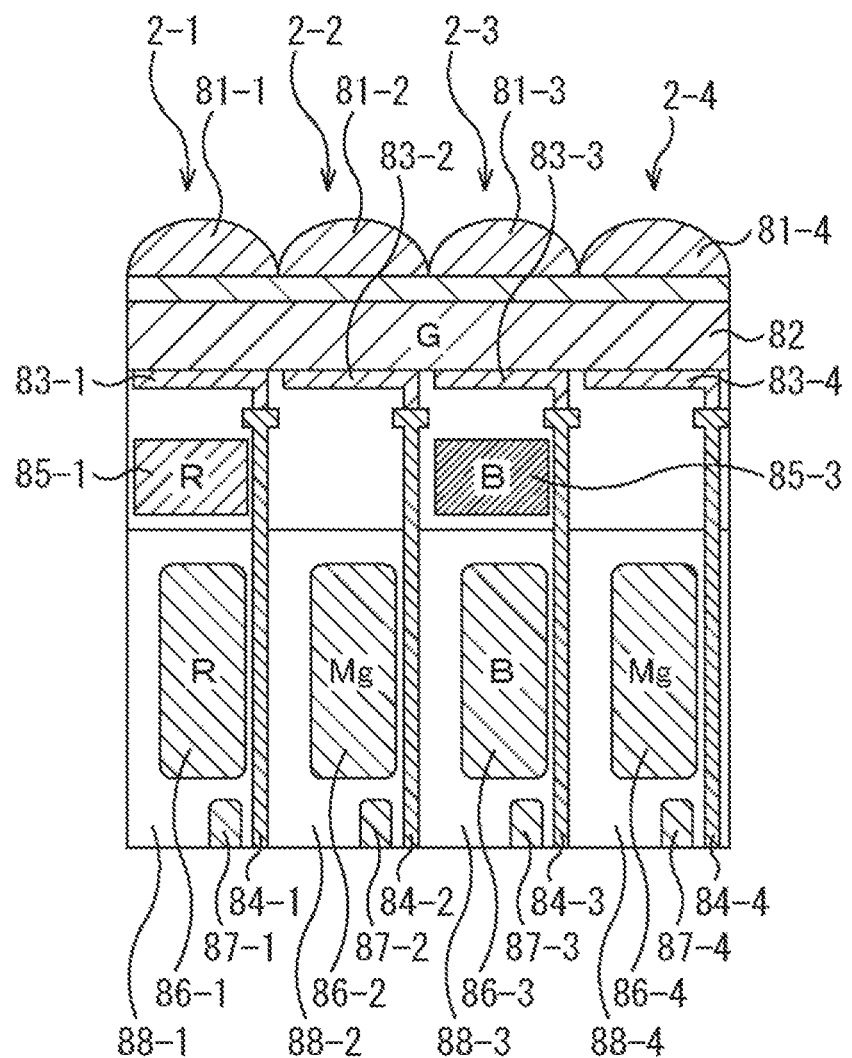
FIG. 3 is an explanatory diagram explaining a structure of a second imaging element.

FIG. 3 is a partially magnified view of the imaging apparatus 1 in FIG. 1. This is a cross-sectional view depicting a structure of the pixels 2 furnished with a G organic photoelectric conversion film and R and B color filters. FIG. 3 depicts, among the multiple pixels 2 arranged two-dimensionally in the pixel section 3, four pixels 2-1 to 2-4 arrayed in a given row direction.

The pixels 2-1 to 2-4 have photodiodes 86-1 to 86-4 and charge storage sections 87-1 to 87-4 formed on the semiconductor substrate (silicon substrate) and buried in silicon (Si) layers 88-1 to 88-4.

Also, a G organic photoelectric conversion film 82 is layered and lenses 81-1 to 81-4 are formed on the semiconductor substrate. Further, of the pixels 2-1 to 2-4, the pixel 2-1 has an R color filter 85-1 formed under the G organic photoelectric conversion film 82 on the light incident side. The pixel 2-3 has a B color filter 85-3 formed under the G organic photoelectric conversion film 82 on the light incident side. The pixels 2-2 and 2-4 are not provided with color filters.

In the pixel 2-1, the light collected by the lens 81-1 enters the G organic photoelectric conversion film 82. Given the incident light from the lens 81-1, the G organic photoelectric conversion film 82 absorbs the green (G) component light and generates signal charges corresponding to the green (G) component light. The signal charges generated by the G organic photoelectric conversion film 82 are collected by a transparent electrode 83-1 arranged according to a pixel pitch and brought into the charge storage section 87-1 for storage through an electrode 84-1.

Also, of the incident light from the lens 81-1, the light passing through the G organic photoelectric conversion film 82 enters the R color filter 85-1. Here, the light passing through the G organic photoelectric conversion film 82 constitutes the red (R) and blue (B) components. Thus the R color filter 85-1 lets the red (R) component light pass through (i.e., the blue (B) component light is cut off), the red (R) component light being incident on the photodiode 86-1. The photodiode 86-1 generates signal charges corresponding to the red (R) component light coming from the R color filter 85-1.

That is, the pixel 2-1 generates the signal charges corresponding to the green (G) component light and the red (R) component light.

In the pixel 2-2, the light collected by the lens 81-2 enters the G organic photoelectric conversion film 82. Given the incident light from the lens 81-2, the G organic photoelectric conversion film 82 absorbs the green (G) component light and generates signal charges corresponding to the green (G) component light. The signal charges generated by the G organic photoelectric conversion film 82 are collected by a transparent electrode 83-2 arranged according to the pixel pitch and brought into the charge storage section 87-2 for storage through an electrode 84-2.

Because no color filter is formed here in the pixel 2-2, the light passing through the G organic photoelectric conversion film 82 directly enters the photodiode 86-2. Also, the light passing through the G organic photoelectric conversion film 82 constitutes the red (R) component light and the blue (B) component light. Thus the photodiode 86-2 generates signal charges corresponding to the magenta (Mg) component light, which is a mixture of the color red (R) and the color blue (B).

That is, the pixel 2-2 generates the signal charges corresponding to the green (G) component light and the magenta (Mg) component light.

In the pixel 2-3, the light collected by the lens 81-3 enters the G organic photoelectric conversion film 82. Given the incident light from the lens 81-3, the G organic photoelectric conversion film 82 absorbs the green (G) component light and generates signal charges corresponding to the green (G) component light. The signal charges generated by the G organic photoelectric conversion film 82 are collected by a transparent electrode 83-3 arranged according to the pixel pitch and brought into the charge storage section 87-3 for storage through an electrode 84-3.

Also, of the incident light from the lens 81-3, the light passing through the G organic photoelectric conversion film 82 enters the B color filter 85-3. Here, the light passing through the G organic photoelectric conversion film 82 constitutes the red (R) component light and the blue (B) component light. Thus the B color filter 85-3 lets the blue (B) component light pass through (i.e., the red (R) component light is cut off), the blue (B) component light being incident on the photodiode 86-3. The photodiode 86-3 generates signal charges corresponding to the blue (B) component light coming from the B color filter 85-3.

That is, the pixel 2-3 generates the signal charges corresponding to the green (G) component light and the blue (B) component light.

The pixel 2-4, like the pixel 2-2, has no color filter formed therein. Thus given the incident light from the lens 81-4, the G organic photoelectric conversion film 82 absorbs the green (G) component light and generates signal charges corresponding to the green (G) component light. Also, the photodiode 86-4 generates signal charges corresponding to the magenta (Mg) component light, which is a mixture of the red (R) component light and blue (B) component light passing through the G organic photoelectric conversion film 82.

That is, the pixel 2-4 generates the signal charges corresponding to the green (G) component light and the magenta (Mg) component light.

The signal charges generated as described above by the pixels 2-1 to 2-4 are read out by a readout section having multiple pixel transistors and are processed by a downstream signal processing section, before being output as image data. Here, the downstream signal processing section processes RGB signals based on the signals corresponding to the green (G) component and red (R) component output from the pixel 2-1 and on the signals corresponding to the green (G) component and blue (B) component output from the pixel 2-3.

The downstream signal processing section further provides signals corresponding to the green (G) component and magenta (Mg) component output from the pixel 2-2. Combining (adding up) these signals provides a W signal that corresponds to the white (W) component. Likewise, the downstream signal processing section provides the signals corresponding to the green (G) component and magenta (Mg) component output from the pixel 2-4. Combining (adding up) these signals provides the W signal corresponding to the white (W) component.

Structure of the Third Imaging Element

Figure 4:
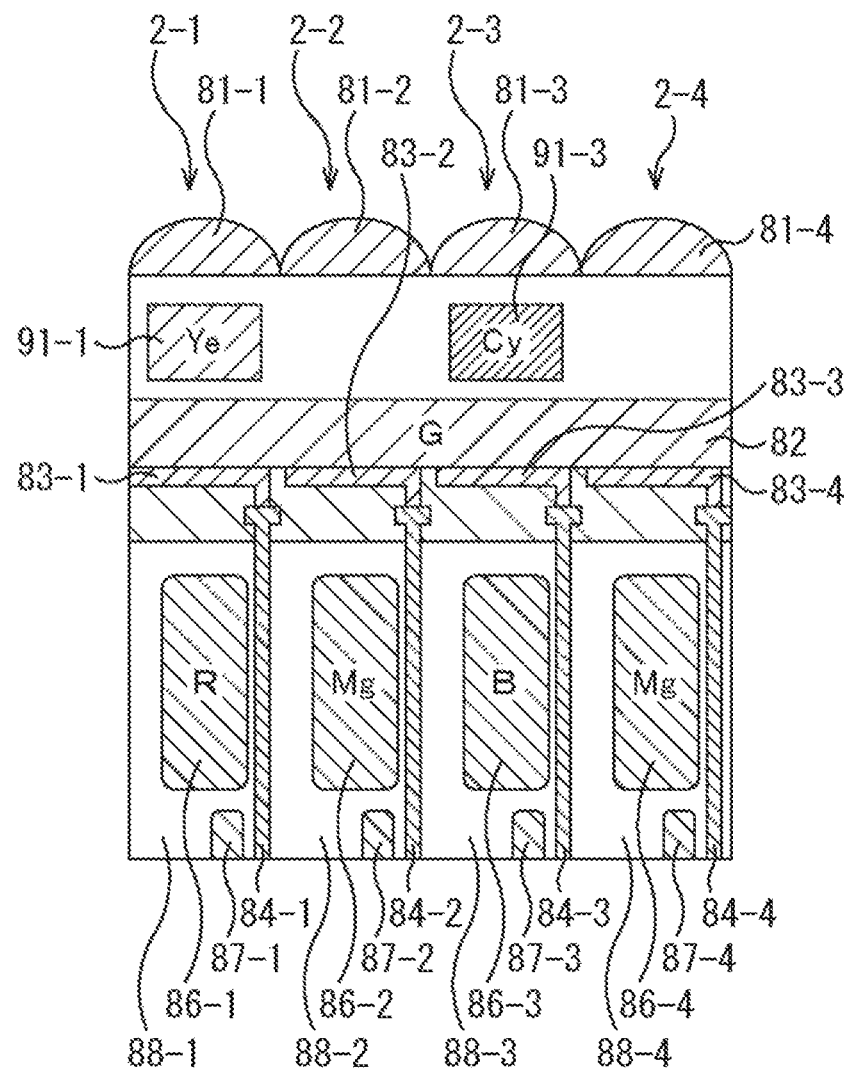
FIG. 4 is an explanatory diagram explaining a structure of a third imaging element.

FIG. 4 is a partially magnified view of the imaging apparatus 1 in FIG. 1. This is a cross-sectional view depicting a structure of the pixels 2 furnished with a G organic photoelectric conversion film and Ye and Cy color filters. FIG. 4 depicts, among the multiple pixels 2 arranged two-dimensionally in the pixel section 3, four pixels 2-1 to 2-4 arrayed in a given row direction.

The pixels 2-1 to 2-4 have photodiodes 86-1 to 86-4 and charge storage sections 87-1 to 87-4 formed on the semiconductor substrate (silicon substrate) and buried in silicon (Si) layers 88-1 to 88-4. Also, a G organic photoelectric conversion film 82 is layered and lenses 81-1 to 81-4 are formed on the semiconductor substrate.

Further, of the pixels 2-1 to 2-4, the pixel 2-1 has a Ye color filter 91-1 formed over the G organic photoelectric conversion film 82 on the light incident side. The pixel 2-3 has a Cy color filter 91-3 formed over the G organic photoelectric conversion film 82 on the light incident side. The pixels 2-2 and 2-4 are not provided with color filters.

In the pixel 2-1, the light collected by the lens 81-1 enters the Ye color filter 91-1. Here, the light passing through the Ye color filter 91-1 constitutes the yellow (Ye) component light, i.e., a mixture of red (R) and green (G). Thus the Ye color filter 91-1 lets the light mixture of red (R) and green (G) pass through and enter the G organic photoelectric conversion film 82.

Given the incident light from the Ye color filter 91-1, the G organic photoelectric conversion film 82 absorbs the green (G) component light and generates signal charges corresponding to the green (G) component light. The signal charges generated by the G organic photoelectric conversion film 82 are collected by the transparent electrode 83-1 arranged according to the pixel pitch and brought into the charge storage section 87-1 for storage through the electrode 84-1.

Also, the light passing through the G organic photoelectric conversion film 82 enters the photodiode 86-1. Here, the light passing through the G organic photoelectric conversion film 82 constitutes the red (R) component light. Thus the photodiode 86-1 generates signal charges corresponding to the red (R) component light passing through the G organic photoelectric conversion film 82.

That is, the pixel 2-1 generates the signal charges corresponding to the green (G) component light and the red (R) component light.

In the pixel 2-2, the light collected by the lens 81-2 enters the G organic photoelectric conversion film 82. Given the incident light from the lens 81-2, the G organic photoelectric conversion film 82 absorbs the green (G) component light and generates signal charges corresponding to the green (G) component light. The signal charges generated by the G organic photoelectric conversion film 82 are collected by the transparent electrode 83-2 arranged according to the pixel pitch and brought into the charge storage section 87-2 for storage through the electrode 84-2.

Because no color filter is formed here in the pixel 2-2, the light collected by the lens 81-2 directly enters the G organic photoelectric conversion film 82. The light passing through the G organic photoelectric conversion film 82 further enters the photodiode 86-2. Also, the light passing through the G organic photoelectric conversion film 82 constitutes the red (R) component light and the blue (B) component light. Thus the photodiode 86-2 generates signal charges corresponding to the magenta (Mg) component light, which is a mixture of the color red (R) and the color blue (B).

That is, the pixel 2-2 generates the signal charges corresponding to the green (G) component light and the magenta (Mg) component light.

In the pixel 2-3, the light collected by the lens 81-3 enters the Cy color filter 91-3. Here, the light passing through the Cy color filter 91-3 constitutes the cyan (Cy) component light, which is a mixture of green (G) and blue (B). Thus the light mixture of green (G) and blue (B) past the Cy color filter 91-3 enters the G organic photoelectric conversion film 82.

Given the incident light from the Cy color filter 91-3, the G organic photoelectric conversion film 82 absorbs the green (G) component light and generates signal charges corresponding to the green (G) component light. The signal charges generated by the G organic photoelectric conversion film 82 are collected by the transparent electrode 83-3 arranged according to the pixel pitch and brought into the charge storage section 87-3 for storage through the electrode 84-3.

Also, the light passing through the G organic photoelectric conversion film 82 enters the photodiode 86-3. Here, the light passing through the G organic photoelectric conversion film 82 constitutes the blue (B) component light. Thus the photodiode 86-3 generates signal charges corresponding to the blue (B) component light passing through the G organic photoelectric conversion film 82.

That is, the pixel 2-3 generates the signal charges corresponding to the green (G) component light and the blue (B) component light.

The pixel 2-4, like the pixel 2-2, has no color filter formed therein. Thus given the incident light from the lens 81-4, the G organic photoelectric conversion film 82 absorbs the green (G) component light and generates signal charges corresponding to the green (G) component light. Also, the photodiode 86-4 generates signal charges corresponding to the magenta (Mg) component light, which is a color mixture of the red (R) component and blue (B) component light passing through the G organic photoelectric conversion film 82.

That is, the pixel 2-4 generates the signal charges corresponding to the green (G) component light and the magenta (Mg) component light.

The signal charges generated as described above by the pixels 2-1 to 2-4 are read out by a readout section having multiple pixel transistors and are processed by a downstream signal processing section, before being output as image data. Here, the downstream signal processing section processes RGB signals based on the signals corresponding to the green (G) component and red (R) component output from the pixel 2-1 and on the signals corresponding to the green (G) component and blue (B) component output from the pixel 2-3.

The downstream signal processing section further provides signals corresponding to the green (G) component and magenta (Mg) component output from the pixel 2-2. Combining (adding up) these signals provides the W signal that corresponds to the white (W) component. Likewise, the downstream signal processing section provides the signals corresponding to the green (G) component and magenta (Mg) component output from the pixel 2-4. Combining (adding up) these signals provides the W signal corresponding to the white (W) component.

Imaging Elements Subject to Pupil Correction

The present technology to be explained below can be applied to the first through the third imaging elements discussed above with reference to FIGS. 2 to 4. The present technology can also be applied to other imaging elements not discussed above, particularly those called vertical spectrum imaging elements. The ensuing explanation will proceed using as an example the third imaging element described above with reference to FIG. 4.

Figure 5:
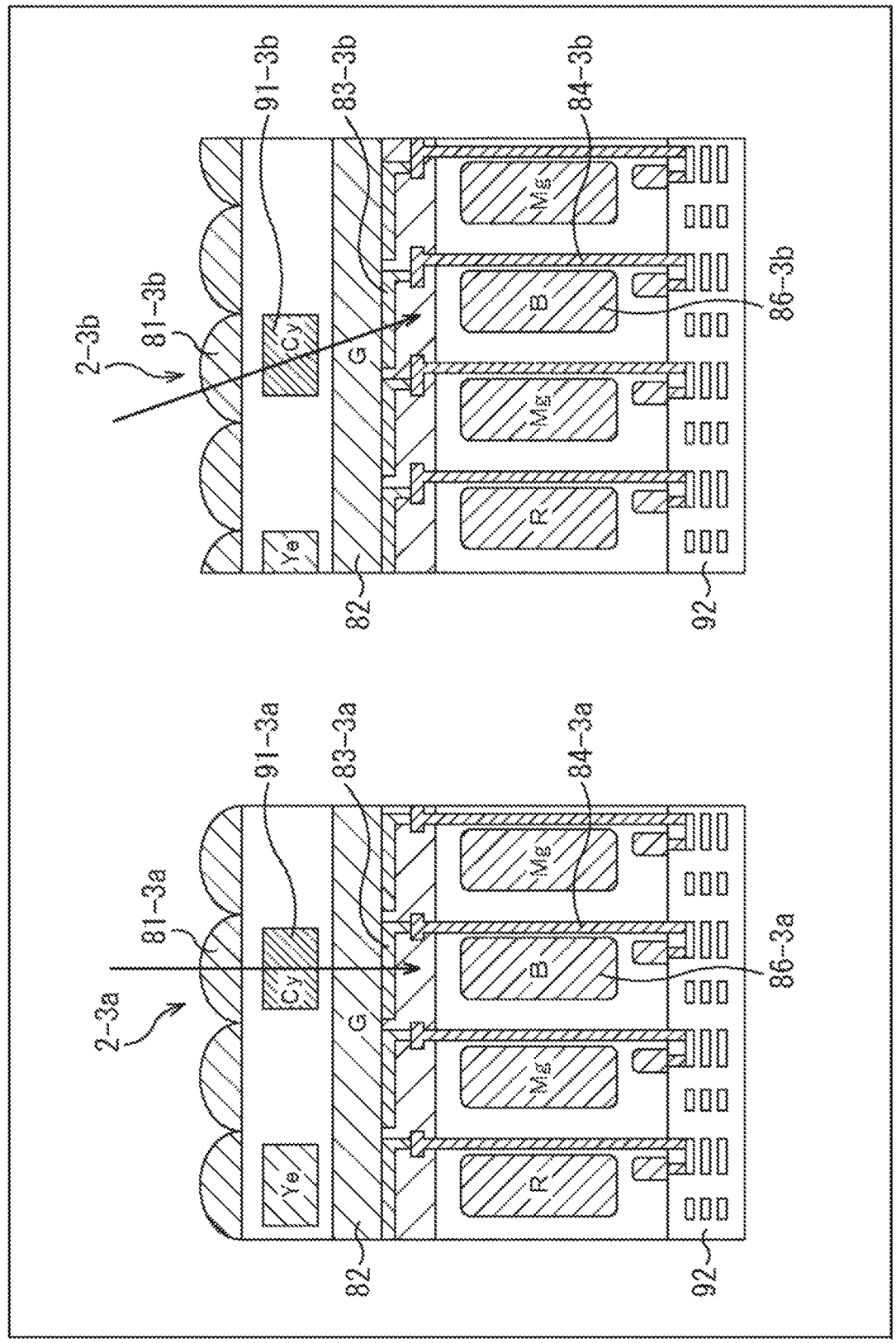
FIG. 5 is a schematic diagram depicting a structure of an embodiment of the imaging element to which the present technology is applied.

FIG. 5 depicts structures of the pixels 2 that take pupil correction into consideration. The left subfigure in FIG. 5 depicts the structure of a pixel 2 at the center of the angle of view. The right subfigure in FIG. 5 illustrates the structure of a pixel 2 at an edge of the angle of view. In the description that follows, reference character "a" is added to the structure of each pixel 2 arranged at the center of the angle of view, and reference character "b" is added to the structure of each pixel 2 arranged at the edge of the angle of view.

Light enters the lens 81 at diverse angles relative to an imaging plane. For this reason, if the structure of the pixel 2 at the center of the angle of view is made similarly to the structure of the pixel 2 at the edge of the angle of view, the incident light is not collected efficiently. There occurs a difference in sensitivity between the pixels 2 at the center of the angle of view and the pixels 2 at the edge of the angle of view.

There exist techniques for attaining constant sensitivity by eliminating the difference in sensitivity between the pixels 2 at the center of the angle of view and the pixels 2 at the edge of the angle of view. For example, there is a technique called pupil correction that involves aligning the optical axis of the lens 81 with the opening of the photodiode 86 at the center of the imaging plane (i.e., at the center of the angle of view) and, toward the edge of the angle of view, shifting the position of the photodiode 86 in keeping with the direction of the principal rays.

For the pixel 2 arranged at the center of the angle of view, incident light enters a photodiode 86-3a in an appropriately vertical manner as indicated by an arrow in the left subfigure in FIG. 5. For the pixel 2 arranged at the edge of the angle of view, by contrast, incident light enters a photodiode 86-3b obliquely as indicated by an arrow in the right subfigure in FIG. 5.

Pupil correction is performed on a lens 81-3b and a Cy color filter 91-3b in such a manner that the oblique incident light is also collected efficiently. The amount of pupil correction is progressively increased away from the center of the angle of view (e.g., from the center of the pixel section) toward the edge of the angle of view.

Referring to the left subfigure in FIG. 5, incident light enters, for example, the lens 81-3a in the central axis direction thereof in the pixel 2 at the center of the angle of view. The incident light collected by the lens 81-3a is spectrally dispersed while passing through a Cy color filter 91-3a before entering the photodiode 86-3a.

That is, in the pixel 2 at the center of the angle of view, the incident light passing through the center of the lens 81-3a passes through the center of the Cy color filter 91-3a to illuminate the center of the photodiode 86-3a. Thus no pupil correction is performed on the pixel 2 at the center of the angle of view.

Referring to the right subfigure in FIG. 5, pupil correction is performed on the lens 81-3b and the Cy color filter 91-3b in the pixel 2 at the edge of the angle of view away from the center of the angle of view, in such a manner that oblique incident light is also collected efficiently. In the right subfigure in FIG. 5, the Cy color filter 91-3b is arranged at a position shifted to the left by a predetermined amount from the opening of the photodiode 86-3b. Furthermore, the lens 81-3b is arranged at a position shifted to the left by a predetermined amount from the Cy color filter 91-3b.

The amounts of shift of the lenses 81 and of the color filters 91 are progressively increased away from the center of the angle of view toward the edge of the angle of view. Besides the lens 81-3b and the Cy color filter 91-3b, a transparent electrode 83-3b is also arranged at a position shifted in keeping with the lens 81-3b and the Cy color filter 91-3b.

Figure 6:
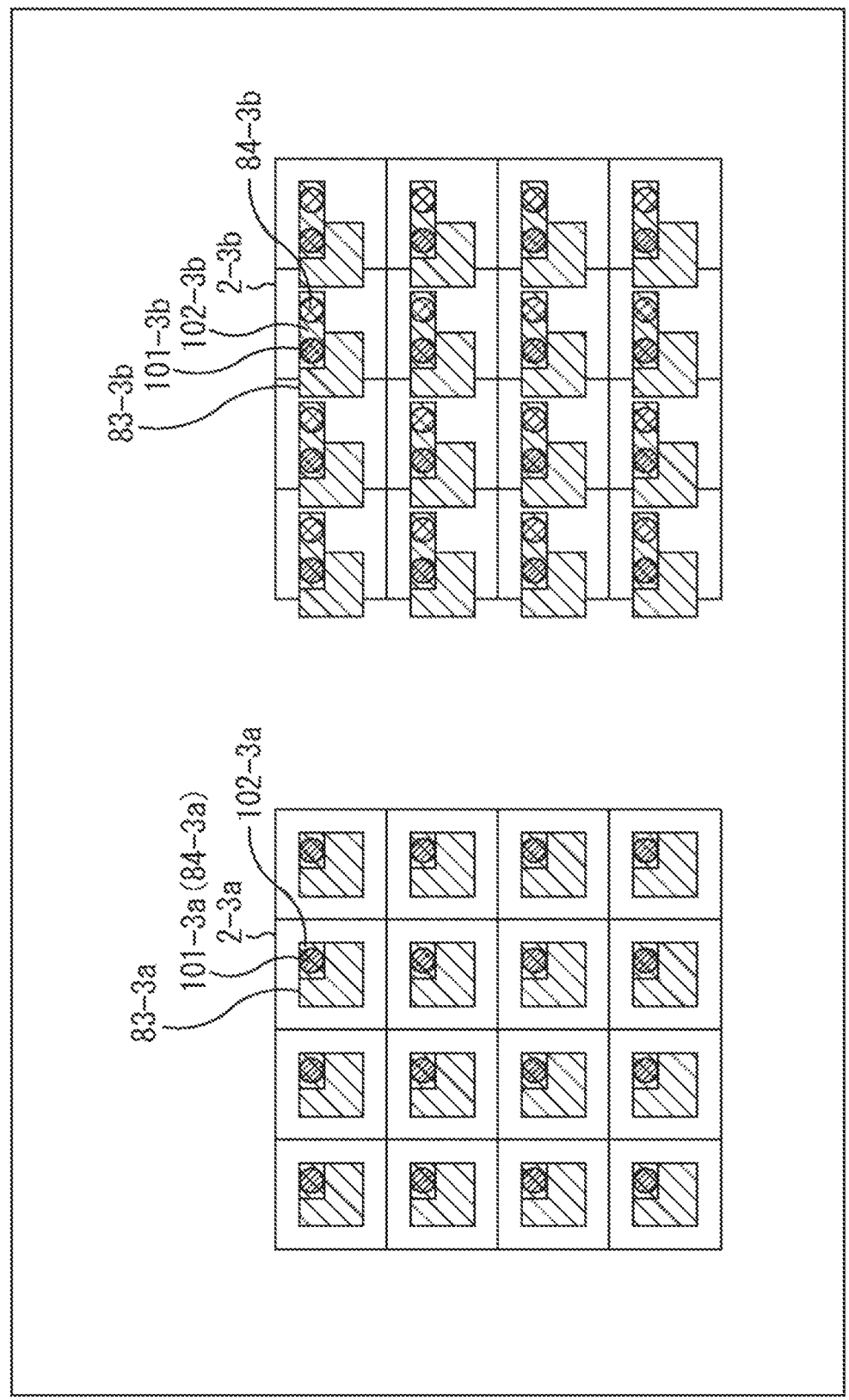
FIG. 6 is an explanatory diagram explaining how electrodes are arranged.

FIG. 6 is a two-dimensional diagram of the pixels 2 as viewed from the side of the lenses 81. The left subfigure in FIG. 6 is a plan view of pixels 2 at the center of the angle of view, and the right subfigure in FIG. 6 is a plan view of pixels 2 at the edge of the angle of view. In the ensuing explanation, the portions referred to as the transparent electrodes 83 and the electrodes 84 in reference to FIGS. 4 and 5 are to be read as first lower electrodes 83, vias 101, second lower electrodes 102, and through-hole electrodes 84 hereunder, as illustrated in FIG. 7.

Figure 7:
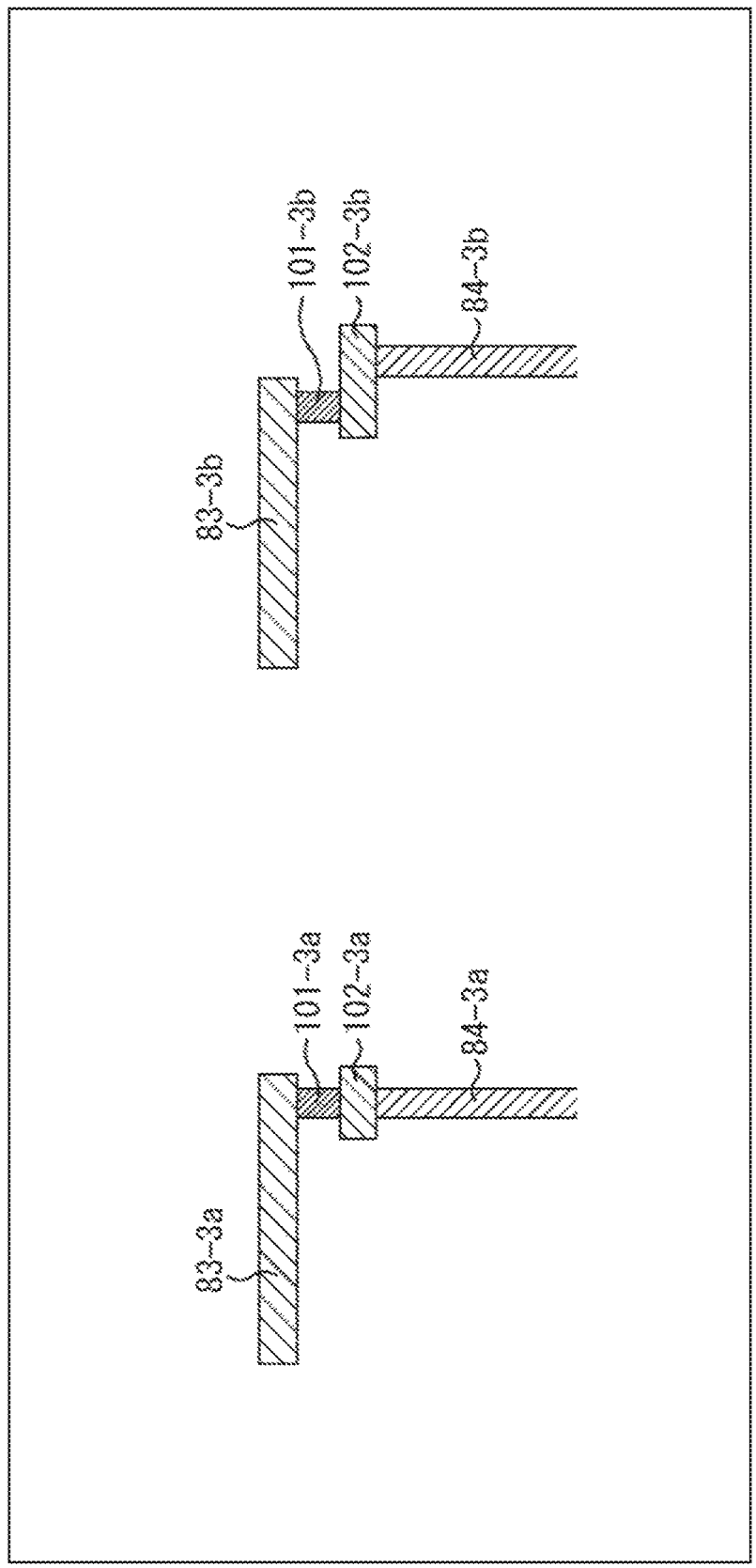
FIG. 7 is an explanatory diagram explaining the amount of shift of vias.

The ensuing explanation will proceed on the assumption that the portions referred to as the first lower electrodes 83 and the vias 101 in FIG. 7 correspond to the transparent electrodes 83 in FIGS. 4 and 5 and that the portions referred to as the second lower electrodes 102 and the through-hole electrodes 84 in FIG. 7 correspond to the electrodes 84 in FIGS. 4 and 5.

Referring to the left subfigure in FIG. 7, a first lower electrode 83-3a of, for example, a pixel 2-3a positioned at the center of the angle of view is connected with a second lower electrode 102-3a through a via 101-3a, the second lower electrode 102-3a being further connected with a through-hole electrode 84-3a. Likewise, referring to the right subfigure in FIG. 7, a first lower electrode 83-3b of, for example, a pixel 2-3b positioned at the edge of the angle of view is connected with a second lower electrode 102-3b through a via 101-3b, the second lower electrode 102-3b being further connected with a through-hole electrode 84-3b.

As described above, the first lower electrode 83 of each pixel 2 is connected with the second lower electrode 102 through the via 101, and the second lower electrode 102 of each pixel 2 is connected with the through-hole electrode 84.

The via 101, formed as a via at the time of manufacture, is filled with the same material as that of, for example, the first lower electrode 83 to constitute an electrode connected with the first lower electrode 83. In the case where the first lower electrode 83 is a transparent electrode formed by a transparent material, the material filling the via 102 may also be the material constituting the transparent electrode, i.e., the same material forming the first lower electrode 83.

The through-hole electrode 84 is formed when a through-hole made at the time of manufacture is filled with an electrode material. The formation of the through-hole electrode 84 is followed by etching of the second lower electrode 102 using techniques such as photolithography, the etched portion being filled with a material that functions as an electrode, e.g., the similar material as that of the through-hole electrode 84.

Alternatively, the second lower electrode 102 may be formed using the same material as that of the first lower electrode 83. In the case where the first lower electrode 83 is a transparent electrode, the second lower electrode 102 may also be constituted as a transparent electrode.

It is to be noted that, as another alternative, the through-hole electrode 84 may be interposed between pixels to function as a shielding wall that prevents leaks of light into adjacent pixels. In the case where the through-hole electrode 84 is to be provided with the light shielding function, the through-hole electrode 84 is formed using a light-shielding material. Opposite to the through-hole electrode 84, the second lower electrode 102 is positioned to partially overlap with the photodiode 86. There is thus a possibility that the second lower electrode 102 may block the light incident on the photodiode 86. In order to reduce that possibility, the second lower electrode 102 may be formed to be a transparent electrode like the first lower electrode 83.

Reference is now made to FIG. 6. The photodiodes 86 are formed at equal distances apart. At the center of the angle of view, the first lower electrode 83-3a is arranged in the middle of the photodiode 86-3a as depicted in the left subfigure in FIG. 6. By contrast, at the edge of the angle of view, the first lower electrode 83-3b is arranged at a position slightly shifted to the left from the center of the photodiode 86-3b (in the direction of the center of the angle of view), as depicted in the right subfigure in FIG. 6.

As described above, at the edge of the angle of view, the first lower electrode 83-3b (transparent electrode 83-3b) is arranged at a position shifted from the light reception section (photodiode 86-3b) provided in the silicon layer 88 for the purpose of pupil correction. This structure minimizes the drop in sensitivity for oblique incident light.

At the center of the angle of view, the via 101-3a and the through-hole electrode 84-3a are formed at approximately the same position as depicted in the left subfigures in FIGS. 6 and 7. At the edge of the angle of view, by contrast, the via 101-3b and the through-hole electrode 84-3b are formed at different positions as illustrated in the right subfigures in FIGS. 6 and 7. In this manner, the positional relation between the via 101 and the through-hole electrode 84 varies depending on the position of each pixel.

Meanwhile, the pixels used, for example, by mobile terminals are fine pixels. In a fine pixel, the aspect of the distance between the light reception section (photodiode 86) of the silicon layer 88 and the photoelectric conversion film 82 with regard to the pixel size is high. For this reason, the amount of pupil correction for the fine pixel tends to be larger. In other words, the amount of pupil correction is enlarged specifically for the fine pixels, with the amounts of shift also increased for the lens 81, color filter 91, and transparent electrode 83 (first lower electrode 83) relative to the photodiode 86.

Consequently, if the via 101-3b and the through-hole electrode 84-3b were formed at the same position, that is, at the same position as in the case of the pixel 2 at the center of the angle of view, instead of those of at different positions, there is a possibility that a via 101-3b' (in the ensuing description, a prime is added to the reference characters of the via 101-3b and of the through-hole electrode 84-3b formed at the same position at the edge of the angle of view) may not be connected with the second lower electrode 102.

Figure 8:
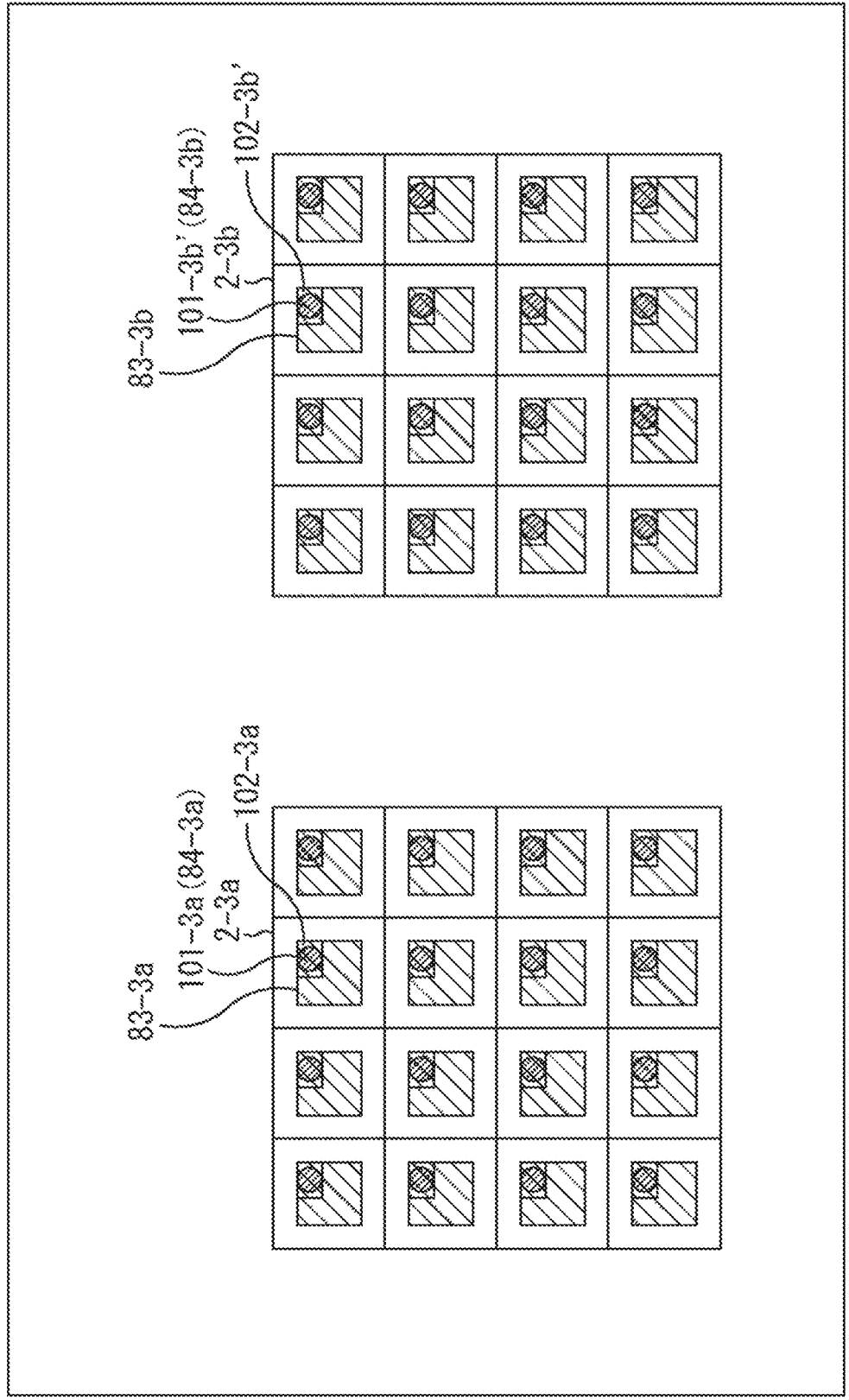
FIG. 8 is an explanatory diagram explaining how electrodes are arranged.

FIG. 8 is a two-dimensional diagram of the via 101-3b' and the through-hole electrode 84-3b' in a putative case where they are formed at the same position. At the edge of the angle of view, the first lower electrode 83-3b is arranged at a position shifted from the first lower electrode 83-3a at the center of the angle of view. Thus in the case where the via 101-3b' is formed at the same position as that of the through-hole electrode 84-3b', there is a possibility that the via 101-3b' may be formed outside the first lower electrode 83-3b.

In that case, the first lower electrode 83-3b is not connected with the via 101-3b'. This causes the first lower electrode 83-3b to be disconnected from the through-hole electrode 84-3b', so that no data can be read from this pixel 2-3b.

That is, when the first lower electrode 83 positioned under the G organic photoelectric conversion film 82 is formed in a manner shifted from the photodiode 86, the drop in sensitivity for oblique incident light is reduced. However, in the case where the amount of pupil correction is large, there is a possibility that the first lower electrode 83 may protrude from the unit pixel in the silicon layer 88. In that case, with the readout circuit of the G organic photoelectric conversion film 82 arranged inside the unit pixel of the silicon substrate, there is a possibility that the potential of the G organic photoelectric conversion film 82 may not be brought into the unit pixel. To reduce that possibility requires limiting the amount of pupil correction and structuring the first lower electrode 83 in such a manner that it will not protrude from the unit pixel in the silicon layer 88.

In order to achieve pupil correction with no constraints on the amount of pupil correction, each pixel 2 includes the first lower metal electrode 83-3b in contact with the G organic photoelectric conversion film 82 and the second lower electrode 102-3b connected with the first lower electrode 83-3b, as depicted in FIGS. 6 and 7. The first lower electrode 83-3b and the via 101-3b connecting the first lower electrode 83-3b with the second lower electrode 102-3b are formed in a manner positionally shifted from the unit pixel in the silicon substrate in accordance with where the electrode 83-3b and the via 101-3b are positioned relative to the optical center.

As described above, with the via 101-3*b* shifted in keeping with the first lower electrode 83-3*b*, even if the first lower electrode 83-3*a* is shifted from the unit pixel in the silicon substrate, the second lower electrode 102-3*b* allows the signals to be sent into the unit pixel in the silicon substrate.

Size of the Second Lower Electrode

Explained below is the size of the second lower electrode 102 in the structure where the via 101-3*b* is shifted in keeping with the first lower electrode 83-3*b*.

Figure 9:
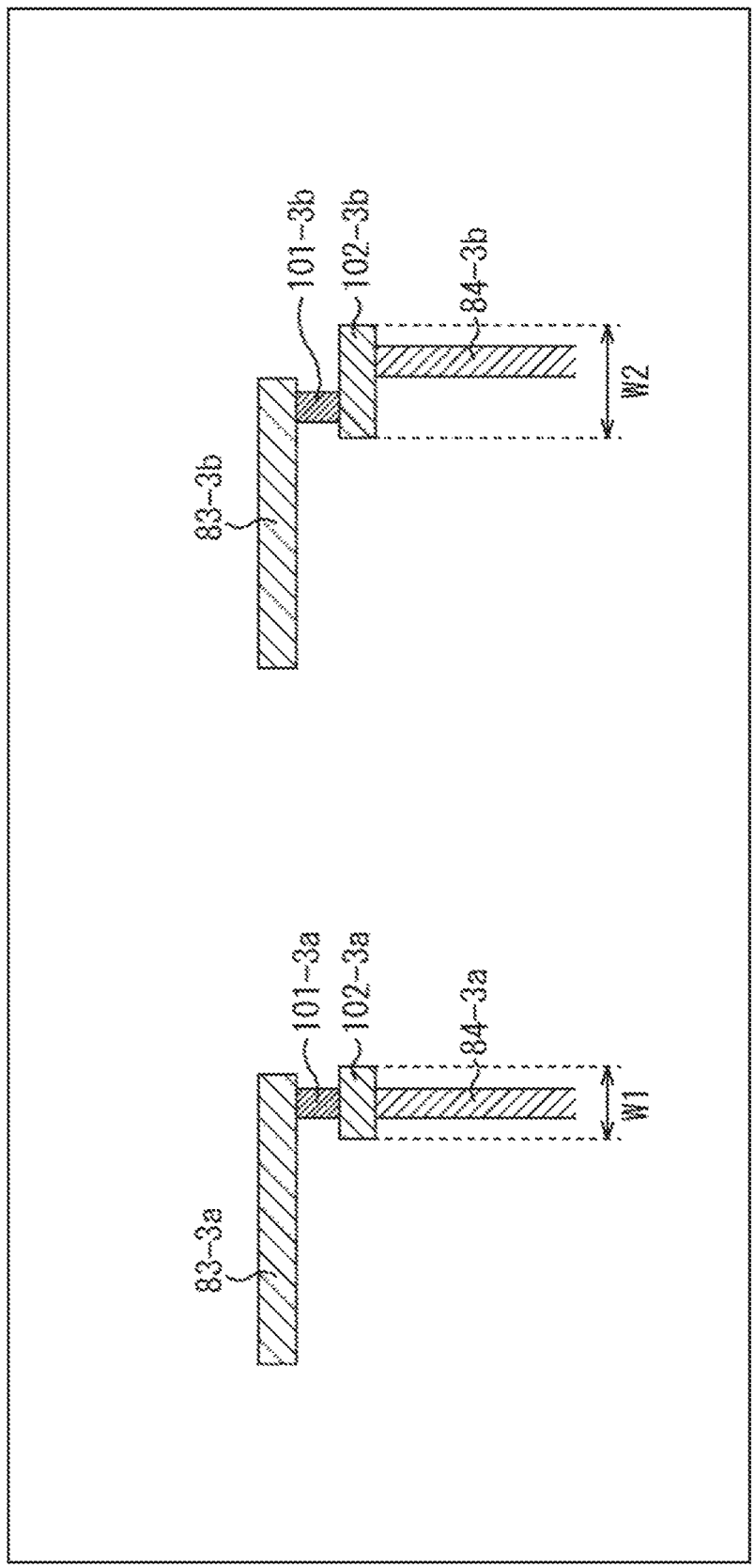
FIG. 9 is an explanatory diagram explaining the amount of shift of vias.

FIG. 9 is an explanatory diagram explaining the size of the second lower electrode 102. The length of the second lower electrode 102-3*a* of a pixel 2 at the center of the angle of view is referred to as the length W1, and the length of the second lower electrode 102-3*b* of a pixel 2 at the edge of the angle of view is referred to as the length W2 hereunder.

The lengths W1 and W2 depicted in FIG. 9 satisfy the relation of W1<W2. That is, the second lower electrode 102-3*b* formed at the edge of the angle of view is made longer (larger) than the second lower electrode 102-3*a* at the center of the angle of view. In this manner, the second lower electrode 102 is formed so that its length will be varied depending on the amount of shift of the via 102.

Thus in the case where the first lower electrode 83 is formed at a position shifted from the photodiode 86 for pupil correction, the position of the via 102 is also shifted in keeping with the shifted first electrode position, and the size of the second lower electrode 102 is enlarged correspondingly. This prevents the situation where the first lower electrode 83-3*b* is not connected with the second lower electrode 102-3*b* at the edge of the angle of view, thereby providing the structure where the signals from the G organic photoelectric conversion film 82 are conveyed unfailingly to the unit pixel in the silicon substrate.

Figure 10:
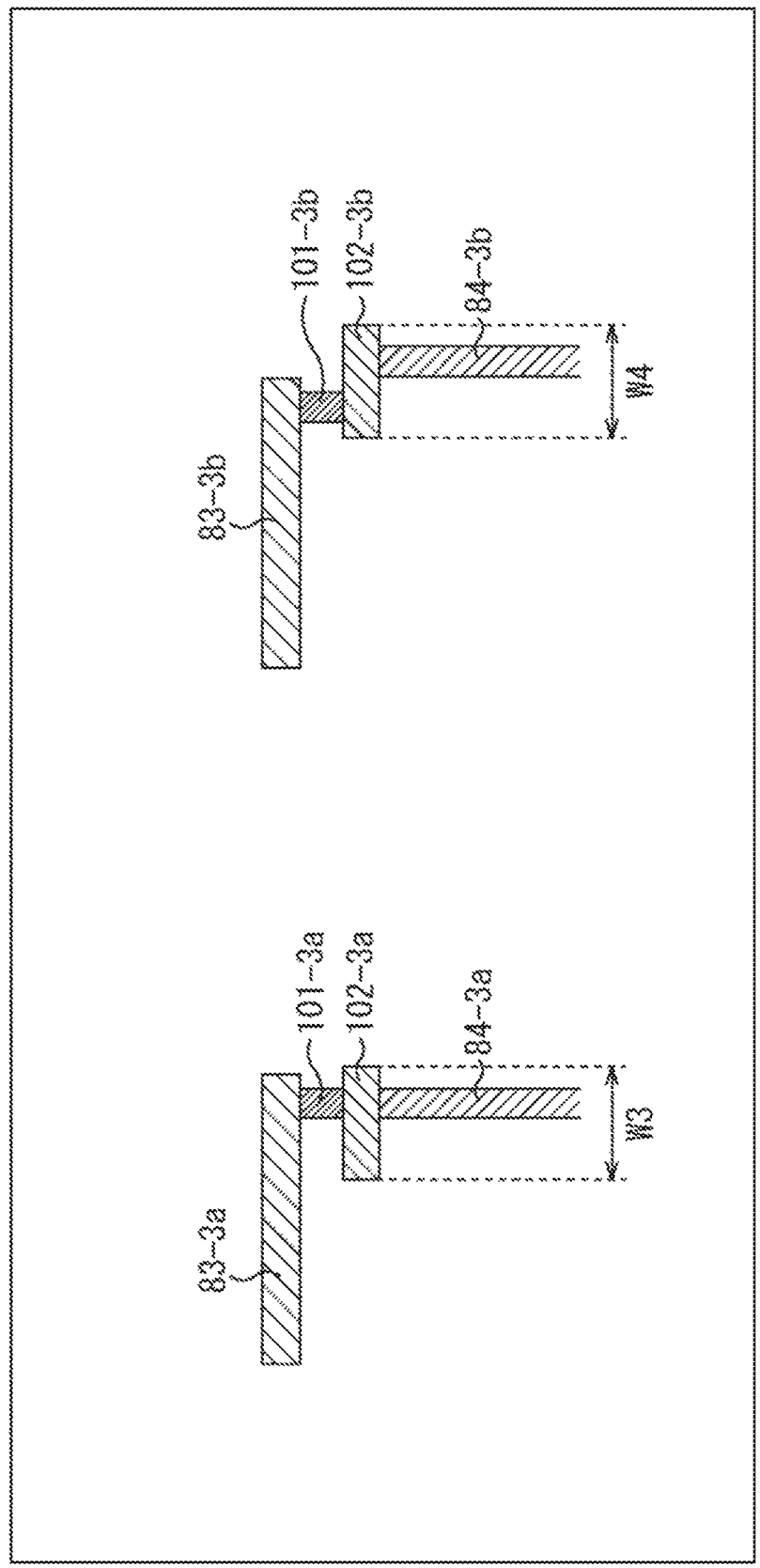
FIG. 10 is an explanatory diagram explaining the amount of shift of vias.

FIG. 10 is an explanatory diagram explaining another size of the second lower electrode 102. The length of the second lower electrode 102-3*a* of a pixel 2 at the center of the angle of view is referred to as the length W3, and the length of the second lower electrode 102-3*b* of a pixel 2 at the edge of the angle of view is referred to as the length W4 hereunder.

The lengths W3 and W4 depicted in FIG. 10 satisfy the relation of W3=W4. That is, the second lower electrode 102-3*b* at the edge of the angle of view is formed to have the same length (size) as the second lower electrode 102-3*a* at the center of the angle of view. In this manner, the second lower electrode 102 is formed to have the same length for all pixels in consideration of the amount of shift of the via 102.

Figure 11:
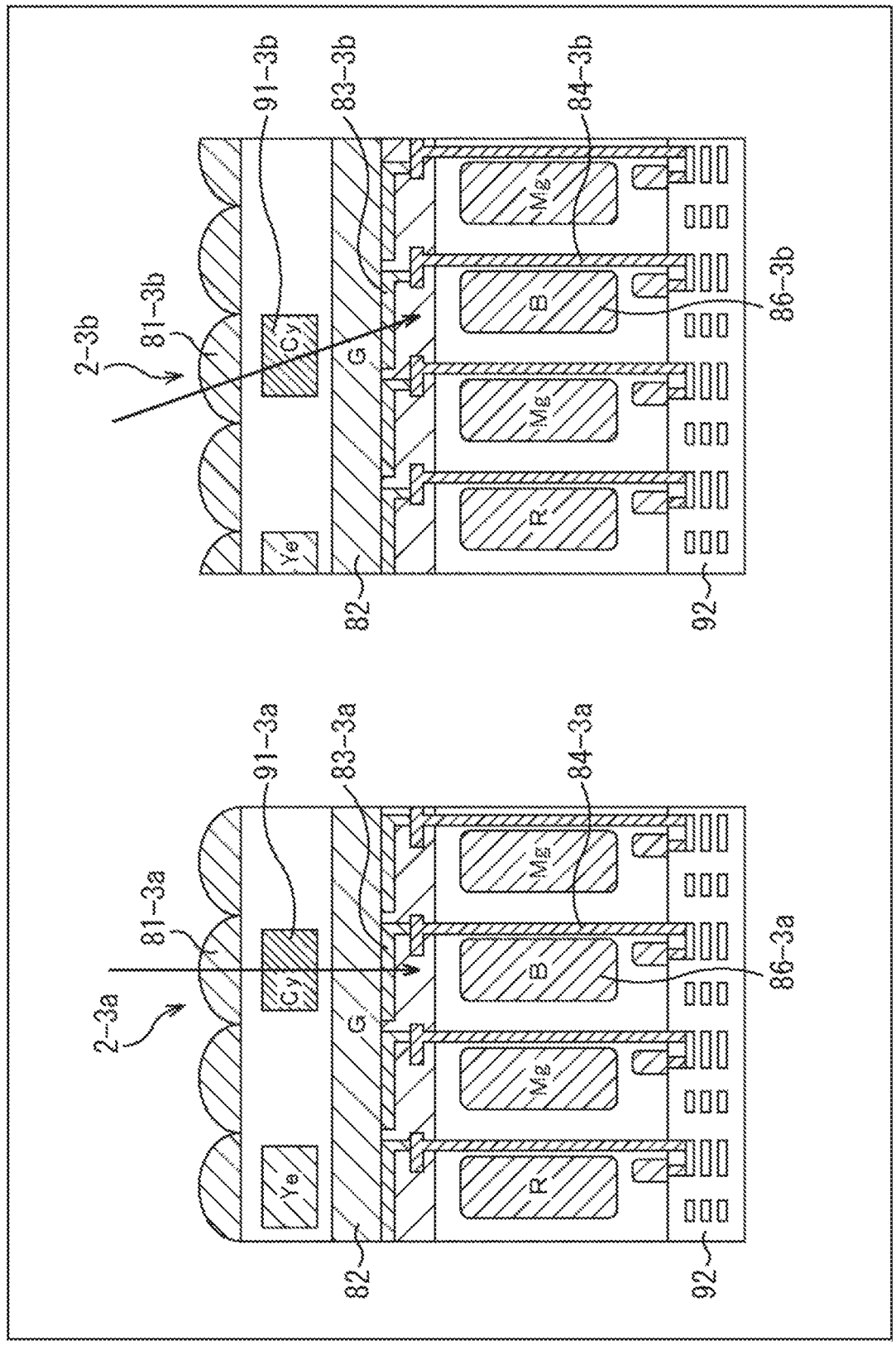
FIG. 11 is an explanatory diagram explaining another structure of the imaging element.
Figure 12:
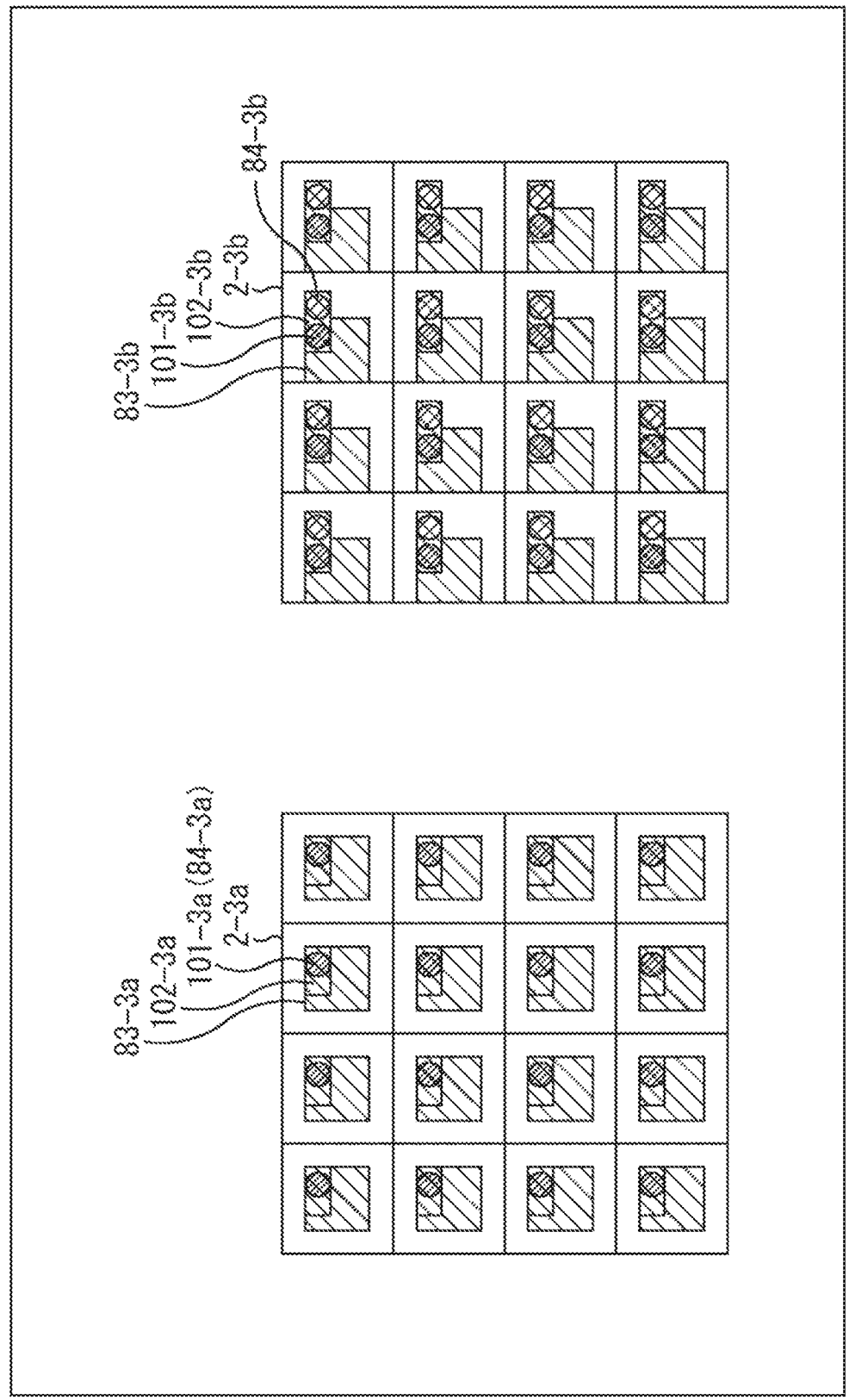
FIG. 12 is an explanatory diagram explaining how electrodes are arranged.

FIGS. 11 and 12 are a cross-sectional diagram and a two-dimensional diagram of pixels, respectively, of the case where the second lower electrode 102-3*a* is formed to have the same size as the second lower electrode 102-3*b*. FIG. 11 gives a cross-sectional diagram of pixels 2 each positioned at the center and at the edge of the angle of view, as in FIG. 5. FIG. 12 gives a two-dimensional diagram of pixels 2 each positioned at the center and at the edge of the angle of view, as in FIG. 6.

As explained above with reference to FIG. 10, the second lower electrode 102-3 is formed to have approximately the same size in all pixels. In each of the pixels positioned at the center of the angle of view, the via 102-3*a* and the through-hole electrode 84-3*a* are arranged at the same position, with the via 102-3*a* positioned on the right of the second lower electrode 102-3*a*.

In the pixels positioned at the edge of the angle of view, the via 102-3*b*, first lower electrode 83-3*b*, and through-hole electrode 84-3*b* are arranged at the same position, with the via 102-3*b* positioned on the left of the second lower electrode 102-3*b*.

In this manner, the via 102 is arranged at a position shifted from the second lower electrode 102-3 by an amount reflecting the amount of shift inside the pixel section 3 (FIG. 1). The second lower electrode 102 is formed to have the size that takes into consideration the amount of such shift beforehand.

In other words, where the second lower electrode 102 is set to be longer than the distance between the center of the via 102-3*b* and the center of the through-hole electrode 84-3*b* in, for example, the pixel 2-3*b* at the edge of the angle of view, the via 102 is formed to be connected unfailingly with the second lower electrode 102 in every pixel 2 inside the pixel section 3. The second lower electrode 102 is thus formed to have the size that brings about the above condition.

Thus in the case where the first lower electrode 83 is formed at a position shifted from the photodiode 86 for pupil correction, the via 102 is arranged at a position shifted in a manner reflecting the amount of such shift, and the second lower electrode 102 is formed to have a size that takes into consideration the amount of the shift. This prevents the situation where the first lower electrode 83-3*b* is not connected with the second lower electrode 102-3*b* also at the edge of the angle of view, thereby providing the structure where the signals from the G organic photoelectric conversion film 82 are conveyed unfailingly to the unit pixel in the silicon substrate.

Second Lower Electrode for Improving Sensitivity

The above-described second lower electrode 102 may be formed as a transparent electrode. In the case where the second lower electrode 102 is a transparent electrode, it is possible to prevent the reflection of incident light by the second lower electrode 102 and thereby to improve sensitivity.

For example, with reference to FIG. 12, suppose a case where the second lower electrode 102 is formed over the photodiode 86. In that case, there is a possibility that incident light is reflected by the second lower electrode 102 so that the amount of light incident on the photodiode 86 may be reduced. However, with the second lower electrode 102 formed as a transparent electrode, the incident light is allowed to pass through the second lower electrode 102 to enter the photodiode 86. This helps improve sensitivity.

Also, as will be explained below with reference to FIG. 13, it is also possible to improve sensitivity by arranging the second lower electrode 102 in a manner bypassing the photodiode 86.

Figure 13:
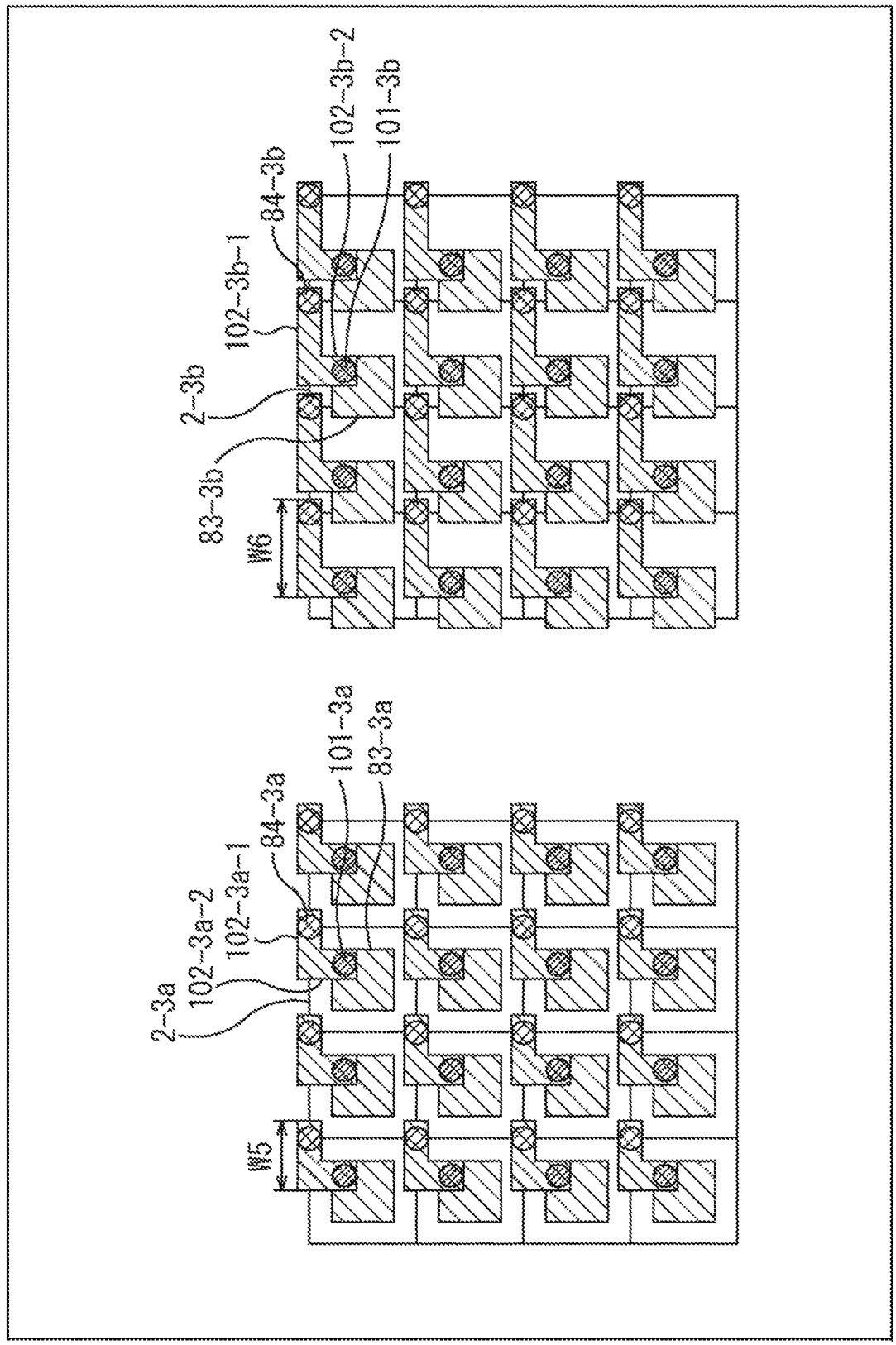
FIG. 13 is an explanatory diagram explaining how electrodes are arranged.

FIG. 13 is an explanatory diagram explaining the shape of the second lower electrode 102. The second lower electrode 102 depicted in FIG. 13 is formed around in the pixel boundary portion. Referring to the left subfigure in FIG. 13, the second lower electrode 102-3*a* over the photodiode 86-3*a* at the center of the angle of view includes a second lower electrode 102-3*a*-1 and a second lower electrode 102-3*a*-2.

The second lower electrode 102-3*a*-1 is arranged horizontally and the second lower electrode 102-3*a*-2 is arranged vertically as viewed in the subfigure. The second lower electrode 102-3*a*-1 is connected with the through-hole electrode 84-3*a*, and the second lower electrode 102-3*a*-2 is connected with the via 101-3*a* (i.e., electrode formed on the via 101-3*a*).

The through-hole electrode 84-3*a* is arranged in the pixel boundary portion. Also, the second lower electrode 102-3*a*-1 connected with the through-hole electrode 84-3a is arranged in the pixel boundary portion.

Likewise, referring to the right subfigure in FIG. 13, the second lower electrode 102-3b over the photodiode 86-3b positioned at the edge of the angle of view includes a second lower electrode 102-3b-1 and a second lower electrode 102-3b-2. The second lower electrode 102-3b-1 arranged horizontally in the subfigure is connected with the through-hole electrode 84-3b, and the second lower electrode 102-3b-2 arranged vertically in the subfigure is connected with the via 101-3b (i.e., electrode formed on the via 101-3b).

The through-hole electrode 84-3b is arranged in the pixel boundary portion. Also, the second lower electrode 102-3b-1 connected with the through-hole electrode 84-3b is arranged in the pixel boundary portion.

When the second lower electrode 102 is arranged in this manner, the area where the first lower electrode 83 overlaps with the second lower electrode 102 is reduced. This minimizes the loss of incident light attributable to the second lower electrode 102.

The second lower electrode 102a of a pixel 2 arranged at the center of the angle of view (e.g., second lower electrode 102-3a-1) is formed to be different in length from the second electrode 102b of a pixel 2 arranged at the edge of the angle of view (e.g., second lower electrode 102-3b-1).

The length of, for example, the second lower electrode 102-3a-1 formed at the center of the angle of view is referred to as the length W5, and the length of, for example, the second lower electrode 102-3b-1 formed at the edge of the angle of view is referred to as the length W6 hereunder. In this case, the lengths W5 and W6 satisfy the relation of W5<W6.

In the pixel section 3 (FIG. 1), the through-hole electrodes 84 are arranged at equal distances apart. The via 101 is arranged to have an amount of shift reflecting its position within the pixel section 3. Thus the distance between the through-hole electrode 84 and the via 101 varies depending on their positions in the pixel section 3. In order to absorb the differences of this distance, the length of each second lower electrode 102-3 (i.e., length of the second lower electrode 102-3-1) is varied as discussed above.

As described above, the second lower electrode 102 is formed in such a manner that its length is varied to reflect the amount of shift of the via 102. Thus in the case where the first lower electrode 83 is formed at a position shifted from the photodiode 86 for pupil correction, the position of the via 102 is also shifted to reflect the shift, and the size of the second lower electrode 102 is enlarged correspondingly. This prevents the situation where the first lower electrode 83-3b is not connected with the second lower electrode 102-3b at the edge of the angle of view, thereby providing the structure where the signals from the G organic photoelectric conversion film 82 are conveyed unfailingly to the unit pixel in the silicon substrate.

Furthermore, when the second lower electrode 102 is formed around in the pixel boundary portion, the area where the first lower electrode 83 overlaps with the second lower electrode 102 is reduced. This minimizes the loss of incident light attributable to the second lower electrode 102.

It is to be noted that, although not illustrated, it is also possible to form the second lower electrodes 102 in approximately the same size for all pixels in the pixel section 3 as explained above with reference to FIGS. 10 to 12, and to have the second lower electrodes 102 formed around in the pixel boundary portion as discussed above with reference to FIG. 13.

That is, the via 102 may be arranged at a position shifted from the second lower electrode 102-3 by the amount reflecting the via position in the pixel section 3 (FIG. 1). The second lower electrodes 102 (e.g., second lower electrode 102-3a-1) may then be formed each to have a size that takes the amount of the shift into consideration beforehand, with the second lower electrodes 102 formed to have approximately the same size in the pixel section 3.

Amount of Shift of Vias

As described above, the vias 102 are each formed at a position shifted by the amount reflecting the via position in the pixel section 3 (FIG. 1). The amount of the shift is further explained below.

Figure 14:
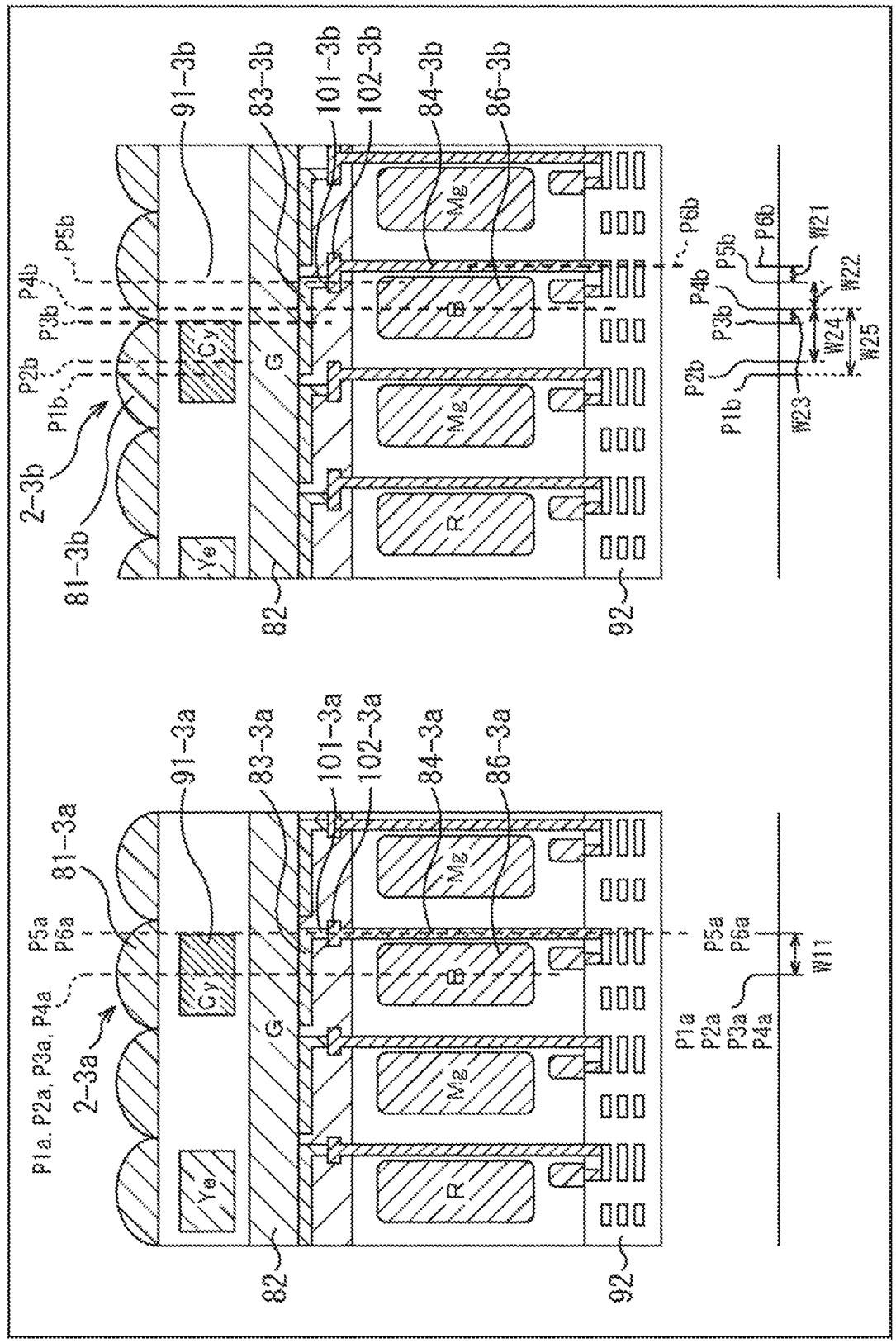
FIG. 14 is an explanatory diagram explaining the amount of pupil correction.

FIG. 14 depicts the positional relations between the color filters 91, first lower electrodes 83, pixels (photodiodes 86) and vias 101, and explains the amounts of the shifts involved. FIG. 14 is a cross-sectional diagram of the pixels depicted in FIG. 5, with reference characters added to the components for the purpose of explaining their positional relations and the amounts of their shifts.

The amounts of shift at the center of the angle of view are explained below with reference to the left subfigure in FIG. 14. A pixel 2-3a is taken as an example to explain the pixels at the center of the angle of view. In the pixel 2-3a, the center line position of the lens 81-3a is referred to as the position P1a, the center line position of the Cy color filer 91-3a as the position P2a, the center line position of the first lower electrode 83-3a as the position P3a, and the center line position of the photodiode 86-3a (pixel) as the position P4a hereunder. Further, the center line position of the via 101-3a is referred to as the position P5a and the center line position of the through-hole electrode 84-3a as the position P6a hereunder.

In the pixel 2-3b at the edge of the angle of view, the center line position of the lens 81-3b is referred to as the position P1b, the center line position of the Cy color filter 91-3b as the position P2b, the center line position of the first lower electrode 83-3b as the position P3b, and the center line position of the photodiode 86-3b (pixel) as the position P4b hereunder. Also, the center line position of the via 101-3b is referred to as the position P5b and the center line position of the through-hole electrode 84-3b as the position P6b. It is assumed here that the center line is a line passing through the center of a given member (e.g., lens 81) and vertically intersecting the layers (in the vertical direction in the subfigures).

At the center of the angle of view, the center line position P1a of the lens 81-3a, the center line position P2a of the Cy color filter 91-3a, the center line position P3a of the first lower electrode 83-3a, and the center line position P4a of the photodiode 86 are the same position. Thus the positional relation of P1a=P2a=P3a=P4a is satisfied. Also, the center line position P5a of the via 101-3a is the same as the center line position P6a of the through-hole electrode 84-3a, so that the positional relation of P5a=P6a is satisfied.

At the edge of the angle of view, the center line position P1b of the lens 81-3b, the center line position P2b of the Cy color filter 91-3b, the center line position P3b of the first lower electrode 83-3b, and the center line position P4b of the photodiode 86 are different positions. Also, the center line position P5b of the via 101-3b and the center line position P6b of the through-hole electrode 84-3b are different positions.

At the center of the angle of view, the distance between the center line position P4a of the photodiode 86-3a and the center line position P5a of the via 101-3a is referred to as the distance W11 hereunder. The distance W11 also constitutes the distance between the center line position P1*a* of the lens 81-3*a* and the center line position P5*a* of the via 101-3*a*, the distance between the center line position P1*a* of the Cy color filter 91-3*a* and the center line position P2*a* of the via 101-3*a*, and the distance between the center line position P3*a* of the first lower electrode 83-3*a* and the center line position P5*a* of the via 101-3*a*.

At the edge of the angle of view, the distance between the center line position P5*b* of the via 101-3*b* related to the photodiode 86-3*b* and the through-hole electrode 84-3*b* is referred to as the distance W21 hereunder. Also, the distance between the center line position P4*b* of the photodiode 86-3*b* and the center line position P5*b* of the via 101-3*b* is referred to as the distance W22 hereunder. Further, the distance between the center line position P4*b* of the photodiode 86-3*b* and the center line position P3*b* of the first lower electrode 83-3*b* is referred to as the distance W23 hereunder.

Furthermore, the distance between the center line position P4*b* of the photodiode 86-3*b* and the center line position P2*b* of the Cy color filter 91-3*b* is referred to as the distance W24 hereunder. The distance between the center line position P4*b* of the photodiode 86-3*b* and the center line position P1*b* of the lens 81-3*b* is referred to as the distance W25 hereunder.

In the pixel 2-3*b* positioned at the edge of the angle of view, the first lower electrode 83-3*b* is arranged at a position shifted by the distance W23 from the photodiode 86-3*b*. Also in the pixel 2-3*b*, the Cy color filter 91-3*b* is arranged at a position shifted by the distance W24 from the photodiode 86-3*b*. Further in the pixel 2-3*b*, the lens 81-3*b* is arranged at a position shifted by the distance W25 from the photodiode 86-3*b*.

As described above, the first lower electrode 83-3*b*, the Cy color filter 91-3*b*, and the lens 81-3*b* are each arranged at positions shifted by predetermined distances from the photodiode 86-3*b*. Also, the first lower electrode 83-3*b*, the Cy color filter 91-3*b*, and the lens 81-3*b* are arranged in such a manner that the distances W23, W24, and W25 satisfy the relation of W25>W24>W23.

The first lower electrode 83-3*a*, the Cy color filter 91-3*a*, and the lens 81-3*a* at the center of the angle of view, as opposed to their counterparts at the edge of the angle of view, are arranged at the same position relative to the photodiode 86-3*a* at the center of the angle of view. These components are not arranged at shifted positions.

As described above, the first lower electrodes 83, the color filters 91, and the lenses 81 at the edge of the angle of view are arranged at positions shifted from the photodiodes 86 to achieve pupil correction.

Also according to the present technology, each via 101 is arranged at a position shifted from the photodiode 86 by the amount of shift reflecting the amounts of shift of the first lower electrode 83, color filter 91, and lens 81. In the example depicted in FIG. 14, the via 101-3*a* is arranged at a position shifted by the distance W22 from the photodiode 86-3*a*.

The distance between the photodiode 86 and the through-hole electrode 84 at the center of the angle of view is the distance W11, the same as the distance therebetween at the edge of the angle of view. Thus at the center of the angle of view, the photodiode 86-3*a* and the via 101-3*a* are arranged at positions the distance W11 apart from each other as discussed above. At the edge of the angle of view, by contrast, the photodiode 86-3*b* and the via 101-3*b* are arranged at positions the distance W22 apart from each other. The distances W11 and W22 satisfy the relation of W11>W22.

Also at the edge of the angle of view, the via 101-3*b* and the through-hole electrode 84-3*b* are arranged at positions the distance W21 apart from each other. The distance W21, the distance W22 between the photodiode 86-3*b* and the via 101-3*b*, and the distance W11 between the photodiode 86-3*b* and the through-hole electrode 84-3*b* have the relation of W11=W21+W22.

The distance W21 or W11 is a distance that reflects the amounts of shift for the pupil correction of the first lower electrodes 83, the color filters 91, and the lenses 81 (i.e., amounts of pupil correction). When the relation between the photodiode 86 and the via 101 is considered, the distance therebetween varies gradually from the distance W11 to the distance W22 from the center of the angle of view toward the edge of the angle of view. In this case, the distances W11 and W22 have the relation of W11>W22, so that the distance between the photodiode 86 and the via 101 is gradually shortened from the center of the angle of view toward the edge of the angle of view.

Also, when the relation between the via 101 and the through-hole electrode 84 is considered, the distance therebetween varies gradually from 0 to the distance W21 from the center of the angle of view toward the edge of the angle of view. In this case, the distance W21 is greater than 0, so that the distance between the via 101 and the through-hole electrode 84 is gradually increased from the center of the angle of view toward the edge of the angle of view.

In the case of the embodiment explained above with reference to FIGS. 5 to 7, the length of the second lower electrode 102 is increased in keeping with the distance between the via 101 and the through-hole electrode 84. That is, the length of the second lower electrode 102 is gradually increased from the center of the angle of view toward the edge of the angle of view. The electrode length may be increased at a rate reflecting the distance between the via 101 and the through-hole electrode 84.

Further, in the case of the embodiment explained above with reference to FIGS. 10 to 12, the length of the second lower electrode 102 is the same for all pixels. In such a case, the length of the second lower electrode 102 is determined by taking into consideration the distance between the via 101 and the through-hole electrode 84 being gradually varied from 0 to the distance W21 from the center of the angle of view toward the edge of the angle of view. For example, the length (size) of the second lower electrode 102 may equal the value that adds together the distance W21 and the length required to connect the second lower electrode 102 with the first lower electrode 83 (via 101) at the center of the angle of view.

Explained below is what is related to the amount of shift of the photodiode 86-3 positioned at the edge of the angle of view. The distance W21 between the through-hole electrode 84-3*b* and the via 101-3*b* is shorter than the distance W24 between the Cy color filter 91-3*b* and the photodiode 86-3*b*. That is, the distances W21 and W24 satisfy the relation of W21<W24. Specifically, as amount of pupil correction, the amount of shift of the Cy color filter 91-3*b* from the photodiode 86-3*b* for pupil correction is larger than the amount of shift of the via 101-3*b* from the through-hole electrode 84-3*b*.

The distance W22 between the via 101-3*b* and the photodiode 86-3*b* is shorter than the distance W24 between the Cy color filter 91-3*b* and the photodiode 86-3*b*. That is, the distances W22 and W24 satisfy the relation of W22<W24. Specifically, as amount of pupil correction, the amount of shift of the Cy color filter 91-3*b* from the photodiode 86-3*b* for pupil correction is larger than the amount of shift of the via 101-3*b* from the photodiode 86-3*b*.

Also, the lens 81-3*b* is shifted further from the photodiode 86-3*b* than from the Cy color filter 91-3*b*. For this reason, as amount of pupil correction, the amount of shift of the lens 81-3*b* from the photodiode 86-3*b* for pupil correction is larger than the amount of shift of the via 101-3*b* from the through-hole electrode 84-3*b*.

Also, as amount of pupil correction, the amount of shift of the lens 81-3*b* from the photodiode 86-3*b* for pupil correction is larger than the amount of shift of the via 101-3*b* from the photodiode 86-3*b*.

As described above, the lenses 81, color filters 91, first lower electrodes 83, and vias 101 at the edge of the angle of view are arranged to be shifted by their respective predetermined amounts of shift. This provides the structure where oblique incident light is allowed to enter the G organic photoelectric conversion film 82 with a minimum of loss, thereby reducing the drop in sensitivity.

Application to Phase Difference Pixels

Figure 15:
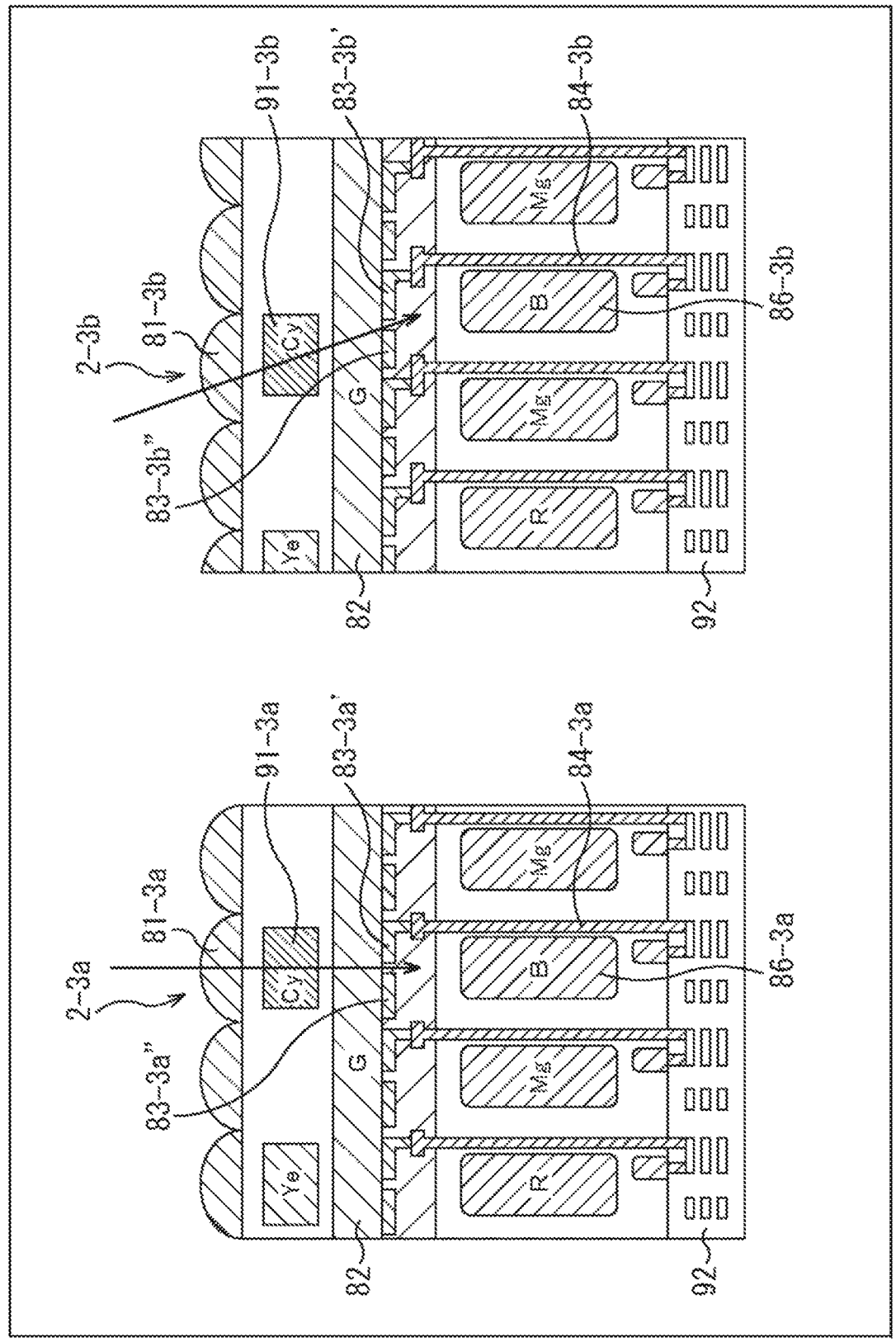
FIG. 15 is an explanatory diagram explaining phase difference pixels.

Explained below with reference to FIG. 15 is how the above-described pixels 2 are used as phase difference pixels as well. In the case where the pixel 2 is used to function as a phase difference pixel, a slit is provided in the first lower electrode 83.

In the pixel 2-3*a*, for example, the slit formed in the first lower electrode 83-3*a* separates this electrode into two electrodes. That is, the first lower electrode 83-3*a* includes a first lower electrode 83-3*a*' and a first lower electrode 83-3*a*''. The first lower electrode 83-3*a*' is connected with the second lower electrode 102-3*a* through the via 101-3*a*, but the first lower electrode 83-3*a*'' is not connected with the second lower electrode 102-3*a*.

In that structure, the first lower electrode 83-3*a*' functions as an electrode that reads out the signal charges generated by the G organic photoelectric conversion film 82, whereas the first lower electrode 83-3*a*'' does not function as an electrode.

For example, in the pixel 2-3*b* positioned at the edge of the angle of view, as in the pixel 2-3*a* positioned at the center of the angle of view, for example, a slit also formed in the first lower electrode 83-3*b* separates this electrode into two electrodes. That is, the first lower electrode 83-3*b* includes a first lower electrode 83-3*b*' and a first lower electrode 83-3*b*''. In this structure, the first lower electrode 83-3*b*' is connected with the second lower electrode 102-3*b* through the via 101-3*b*, whereas the first lower electrode 83-3*b*'' is not connected with the second lower electrode 102-3*b*.

In the above structure, the first lower electrode 83-3*b*' functions as an electrode that reads out the signal charges generated by the G organic photoelectric conversion film 82, but the first lower electrode 83-3*b*'' does not function as an electrode.

The positional relation between the slit position and the optical axis at the center of the angle of view is different from at the edge of the angle of view. The optical axis of, for example, the pixel 2-3*a* positioned at the center of the angle of view approximately coincides with the position of the slit in the first lower electrode 83-3*a*. In other words, the slit position of the first lower electrode 83-3*a* is on the optical axis of the pixel 2-3*a*.

At the edge of the angle of view, the optical axis of, for example, the pixel 2-3*b* positioned at the edge of the angle of view is different from the slit position of the first lower electrode 83-3*b*. In the example depicted in FIG. 15, the slit position of the first lower electrode 83-3*b* is shifted on the left of the optical axis of the pixel 2-3*b*. The shift of the slit position is attributable to the first lower electrode 83-3*b* being arranged at a position shifted from the photodiode 86-3*b* for pupil correction as discussed above.

In the case where the slit is formed in the first lower electrode 83 as discussed above, the above-described embodiments may be adopted selectively to permit appropriate pupil correction, the embodiments constituting the structure in which, for example, the first lower electrode 83 at the center of the angle of view is made different in size from the first lower electrode 83 at the edge of the angle of view or in which the via 102 at the center of the angle of view is positioned in a manner different from the via 102 at the edge of the angle of view for example.

As described above, forming the slit in the first lower electrode 83 allows it to be used as a phase difference pixel as well. Further, when the slit position at the center of the angle of view is different from the slit position at the edge of the angle of view, there is provided a structure that achieves pupil correction. This structure using the phase difference pixels makes auto-focus faster while providing pupil correction.

Other Positions where Color Filters are Arranged

Described above with reference to FIGS. 5 to 15 were the examples in which pupil correction is performed on the pixels 2 depicted in FIG. 4. It is also possible to carry out the pupil correction described above with reference to FIGS. 5 to 15, on the pixels 2 illustrated in FIG. 3.

Figure 16:
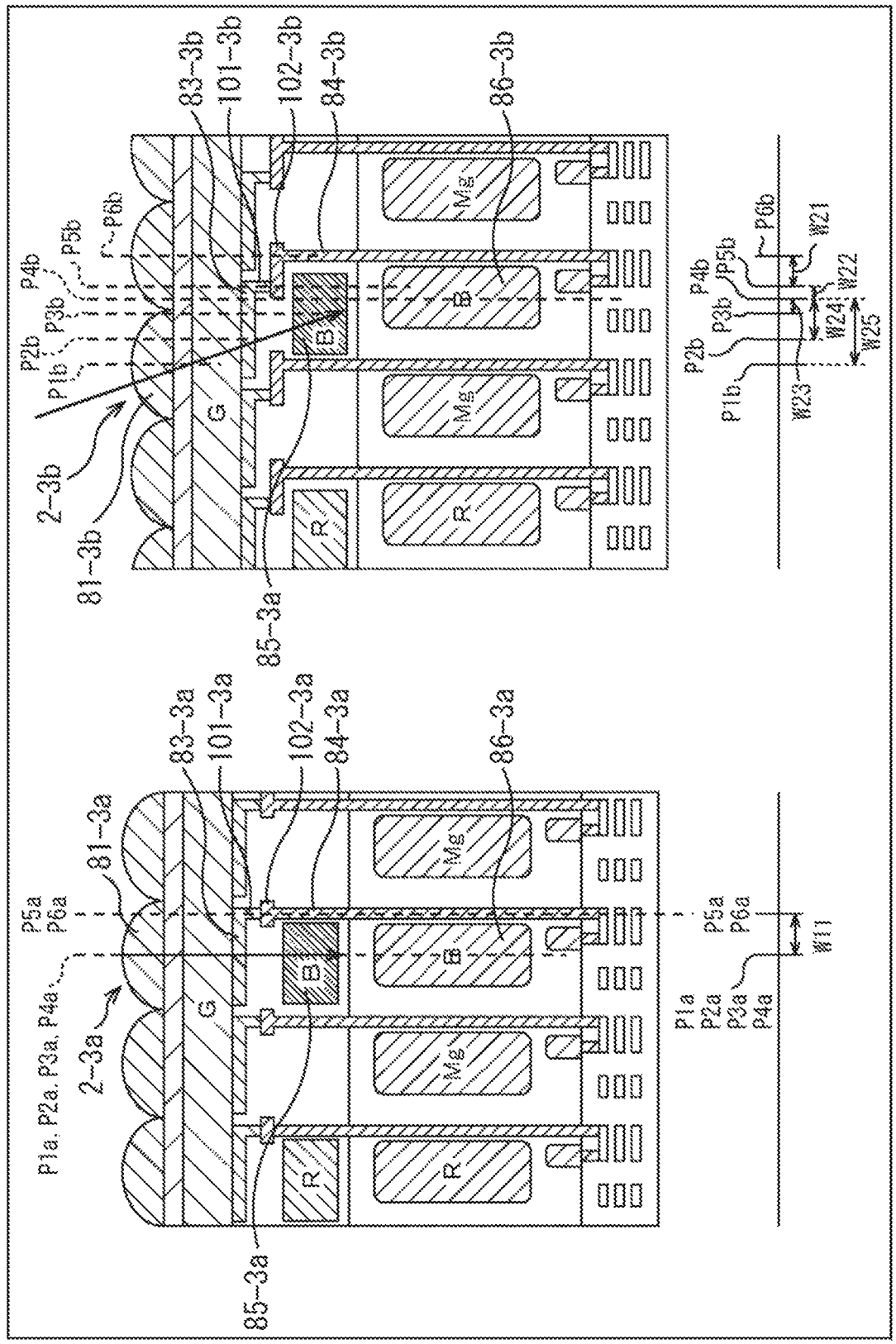
FIG. 16 is an explanatory diagram explaining the amount of pupil correction.

FIG. 16 depicts the structure of the pixels 2 in FIG. 3 on which pupil correction is performed and to which the above-described embodiments are applied. The left subfigure in FIG. 16 depicts the structure of a pixel 2 at the center of the angle of view, and the right subfigure in FIG. 16 illustrates the structure of a pixel 2 at the edge of the angle of view. Each pixel 2 has the similar structure as that of the pixels 2 in FIG. 3, so that the structure will not be discussed further.

For example, in the pixel 2-3*a* positioned at the center of the angle of view, the center line position of the lens 81-3*a* is referred to as the position P1*a*, the center line position of the first lower electrode 83-3*a* as the position P2*a*, the center line position of a color filter 85-3*a* as the position P3*a*, and the center line position of the photodiode 86-3*a* (pixel) as the position P4*a* hereunder. Further, the center line position of the via 101-3*a* is referred to as the position P5*a* and the center line position of the through-hole electrode 84-3*a* as the position P6*a* hereunder.

At the center of the angle of view, the center line position P1*a* of the lens 81-3*a*, the center line position P2*a* of the first lower electrode 83-3*a*, the center line position P3*a* of the B color filter 85-3*a*, and the center line position P4*a* of the photodiode 86 are the same position. Thus these center line positions satisfy the relation of P1*a*=P2*a*=P3*a*=P4*a*. Also, the center line position P5*a* of the via 101-3*a* and the center line position P6*a* of the through-hole electrode 84-3*a* are the same position, so that these positions satisfy the relation of P5*a*=P6*a*.

In the pixel 2-3*b* at the edge of the angle of view, the center line position of the lens 81-3*b* is referred to as the position P1*b*, the center line position of the first lower electrode 83-3*b* as the position P2*b*, the center line position of the color filter 85-3*b* as the position P3*b*, and the center line position of the photodiode 86-3*b* (pixel) as the position P4*b* hereunder. Further, the center line position of the via 101-3*b* is referred to as the position P5*b* and the center line position of the through-hole electrode 84-3*b* as the position P6*b* hereunder.

At the edge of the angle of view, the center line position P1$b$ of the lens 81-3$b$, the center line position P2$b$ of the first lower electrode 83-3$b$, the center line position P3$b$ of the color filter 85-3$b$, and the center line position P4$b$ of the photodiode 86 are different positions. Also, the center line position P5$b$ of the via 101-3$b$ and the center line position P6$b$ of the through-hole electrode 84-3$b$ are different positions.

In the pixel 2-3$b$ positioned at the edge of the angle of view, the B color filter 85-3$b$ is arranged at a position shifted from the photodiode 86-3$b$ by the distance W23. Also in the pixel 2-3$b$, the first lower electrode 83-3$b$ is arranged at a position shifted from the photodiode 86-3$b$ by the distance W24. Further in the pixel 2-3$b$, the lens 81-3$b$ is arranged at a position shifted from the photodiode 86-3$b$ by the distance W25.

As described above, the B color filter 85-3$b$, first lower electrode 83-3$b$, and lens 81-3$b$ are arranged at positions shifted from the photodiode 86-3$b$ by their respective predetermined distances. Also, the B color filter 85-3$b$, first lower electrode 83-3$b$, and lens 81-3$b$ are arranged in such a manner that the distances W23, W24 and W25 satisfy the relation of W25>W24>W23.

When the color filter 85-3$b$, the first lower electrode 83-3$b$, and the lens 81-3$b$ are arranged at positions shifted from the photodiode 86 at the edge of angle of view in the manner described above, pupil correction is carried out.

Also according to the present technology, the via 101 is arranged at a position shifted from the photodiode 86 by an amount reflecting the amounts of shift of the color filter 85, first lower electrode 83, and lens 81. In the example depicted in FIG. 16, the via 101-3$b$ is arranged at a position shifted from the photodiode 86-3$b$ by the distance W22.

The distance between the photodiode 86 and the through-hole electrode 84 at the center of the angle of view is the distance W11, the same as the distance therebetween at the edge of the angle of view. Thus as described above, at the center of the angle of view, the photodiode 86-3$b$ and the via 101-3$a$ are arranged at positions the distance W11 apart from each other. At the edge of the angle of view, by contrast, the photodiode 86-3$b$ and the via 101-3$a$ are arranged at positions the distance W22 apart from each other. The distances W11 and W22 satisfy the relation of W11>W22.

Also at the edge of the angle of view, the via 101-3$b$ and the through-hole electrode 84-3$b$ are arranged at positions the distance W21 apart from each other. The distance W21, the distance W22 between the photodiode 86-3$b$ and the via 101-3$b$, and the distance W11 between the photodiode 86-3$b$ and the through-hole electrode 84-3$b$ have the relation of W11=W21+W22.

The distance W21 or W22 is a distance that reflects the amounts of shift for the pupil correction of the first lower electrode 83, the color filter 85, and the lens 81 (i.e., amounts of pupil correction). When the relation between the photodiode 86 and the via 101 is considered, the distance therebetween varies gradually from the distance W11 to the distance W22 from the center of the angle of view toward the edge of the angle of view. In this case, the distances W11 and W22 have the relation of W11>W22, so that the distance between the photodiode 86 and the via 101 is gradually shortened from the center of the angle of view toward the edge of the angle of view.

Also, when the relation between the via 101 and the through-hole electrode 84 is considered, the distance therebetween varies gradually from 0 to the distance W21 from the center of the angle of view toward the edge of the angle of view. In this case, the distance W21 is greater than 0, so that the distance between the via 101 and the through-hole electrode 84 is gradually increased from the center of the angle of view toward the edge of the angle of view.

In the case where the embodiment explained above with reference to FIGS. 5 to 7 is applied to the embodiment depicted in FIG. 16, the length of the second lower electrode 102 is increased in keeping with the distance between the via 101 and the through-hole electrode 84. That is, the length of the second lower electrode 102 is gradually increased from the center of the angle of view toward the edge of the angle of view. The second electrode length may be increased at a rate reflecting the distance between the via 101 and the through-hole electrode 84.

Also, in the case where the embodiment explained above with reference to FIGS. 10 to 12 is applied to the embodiment depicted in FIG. 16, the length of the second lower electrode 102 is kept the same for all pixels. In such a case, the length of the second lower electrode 102 is determined by taking into consideration the distance between the via 101 and the through-hole electrode 84 being gradually varied from 0 to the distance W21 from the center of the angle of view toward the edge of the angle of view. For example, the length (size) of the second lower electrode 102 may equal the value that adds together the distance W21 and the length required to connect the second lower electrode 102 with the first lower electrode 83 (via 101) at the center of the angle of view.

Explained below is what is related to the amount of shift of the photodiode 86-3 positioned at the edge of the angle of view. The distance W21 between the through-hole electrode 84-3$b$ and the via 101-3$b$ is shorter than the distance W23 between the B color filter 85-3$b$ and the photodiode 86-3$b$. That is, the distances W21 and W23 satisfy the relation of W21<W23. Specifically, as amount of pupil correction, the amount of shift of the B color filter 85-3$b$ from the photodiode 86-3$b$ for pupil correction is larger than the amount of shift of the via 101-3$b$ from the through-hole electrode 84-3$b$.

Also, the lens 81-3$b$ is shifted further from the photodiode 86-3$b$ than from the B color filter 85-3$b$. For this reason, as amount of pupil correction, the amount of shift of the lens 81-3$b$ from the photodiode 86-3$b$ for pupil correction is larger than the amount of shift of the via 101-3$b$ from the through-hole electrode 84-3$b$.

Also, as amount of pupil correction, the amount of shift of the lens 81-3$b$ from the photodiode 86-3$b$ for pupil correction is larger than the amount of shift of the via 101-3$b$ from the photodiode 86-3$b$.

As described above, the lenses 81, first lower electrodes 83, color filters 85, and vias 101 at the edge of the angle of view are arranged to be shifted by their respective predetermined amounts of shift. This provides the structure where oblique incident light is allowed to enter the G organic photoelectric conversion film 82 with a minimum of loss, thereby reducing the drop in sensitivity.

Figure 17:
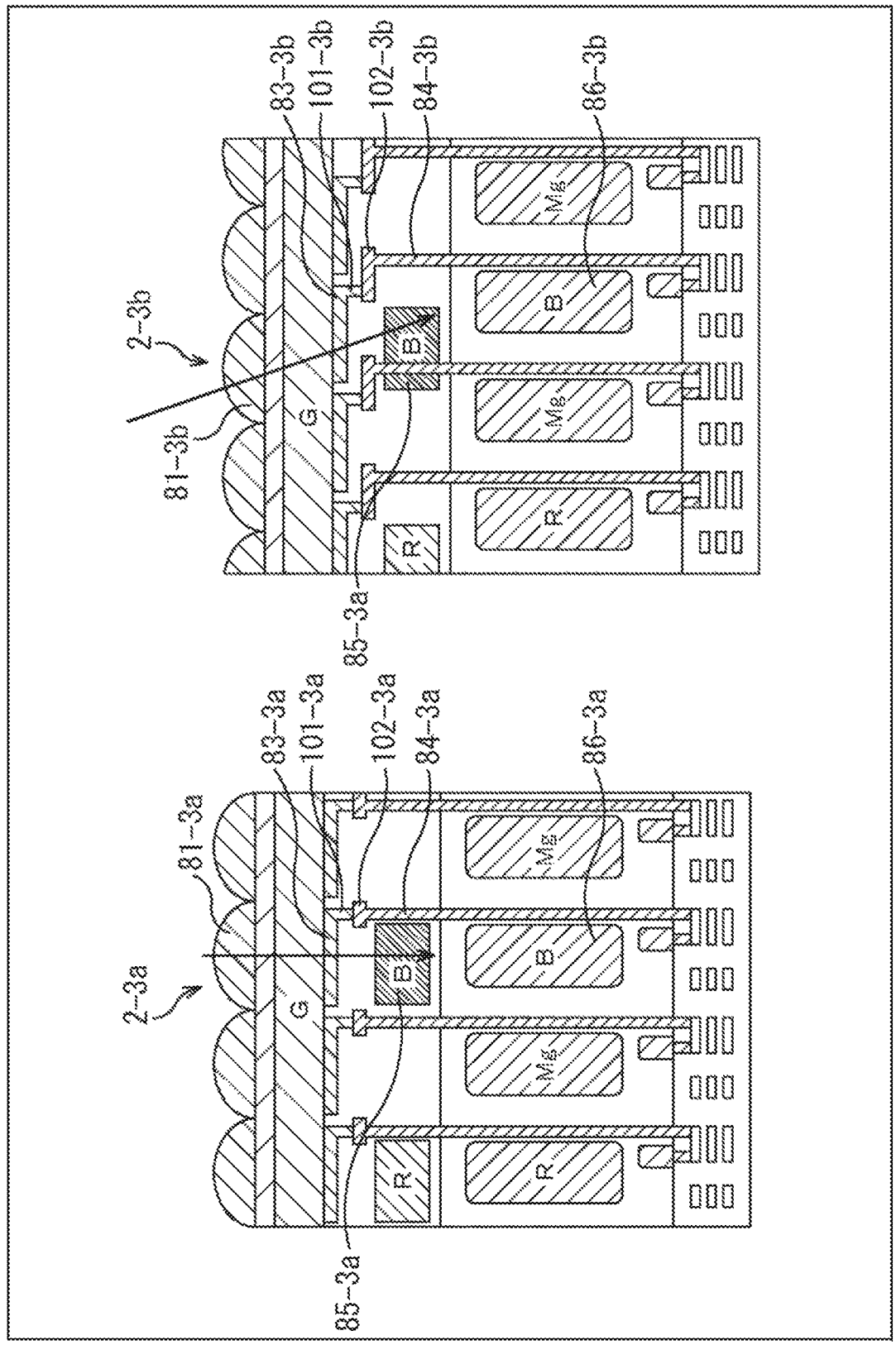
FIG. 17 is an explanatory diagram explaining how electrodes are arranged.

In the pixels 2 depicted in FIG. 16, the color filter 85 is arranged between the through-hole electrodes 84. At the edge of the angle of view, the color filter 85 is arranged, for example, on the left of the midpoint between the through-hole electrodes 84 for pupil correction. As depicted in FIG. 17, the color filter 85 may alternatively be arranged at a position spanning the through-hole electrode 84. The color filter 85 may thus be arranged so as to provide the amount of pupil correction.

Figure 18:
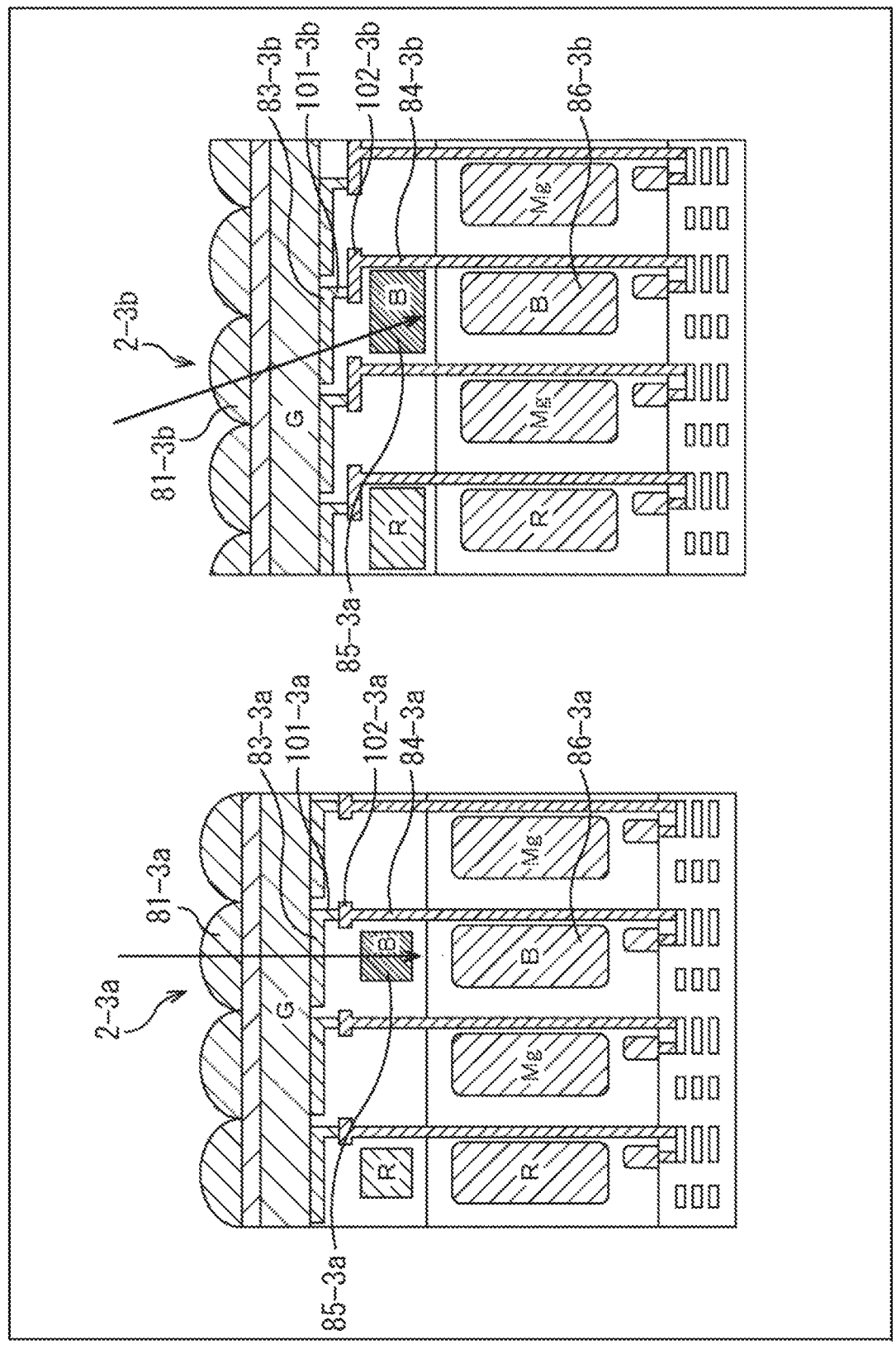
FIG. 18 is an explanatory diagram explaining another structure of the imaging element.

Also, as depicted in FIG. 18, the color filter 85 at the center of the angle of view may be sized differently from at the edge of the angle of view so as to provide the amount of pupil correction. In FIG. 18, the B color filter 85-3*a* arranged in the pixel 2-3*a* positioned at the center of the angle of view is formed to be smaller in size than the B color filter 85-3*b* in the pixel 2-3*b* positioned at the edge of the angle of view.

When the color filters 85 are structured as described above, it is possible to obtain the same effect as when the color filters 85 are arranged in positions shifted in a manner corresponding to the amount of pupil correction.

Even with the color filters 85 shaped as depicted in FIGS. 17 and 18, the lenses 81, color filters 85, first lower electrodes 83, and vias 101 at the edge of the angle of view are arranged to be shifted by their respective predetermined amounts of shift. This provides the structure where oblique incident light is allowed to enter the G organic photoelectric conversion film 82 with a minimum of loss, thereby reducing the drop in sensitivity.

Arrangement of Through-Hole Electrodes

The arrangement of the through-hole electrodes 84 is explained further below. In the example explained above with reference to FIG. 6, the through-hole electrode 84 is formed on the left of the pixel 2. As depicted in FIG. 6, the through-hole electrode 84 may be provided on the same side of every pixel 2 in the pixel section 3. Alternatively, as depicted in FIG. 19, the through-hole electrode 84 may be provided on a different side of each adjacent pixel 2.

Figure 19:
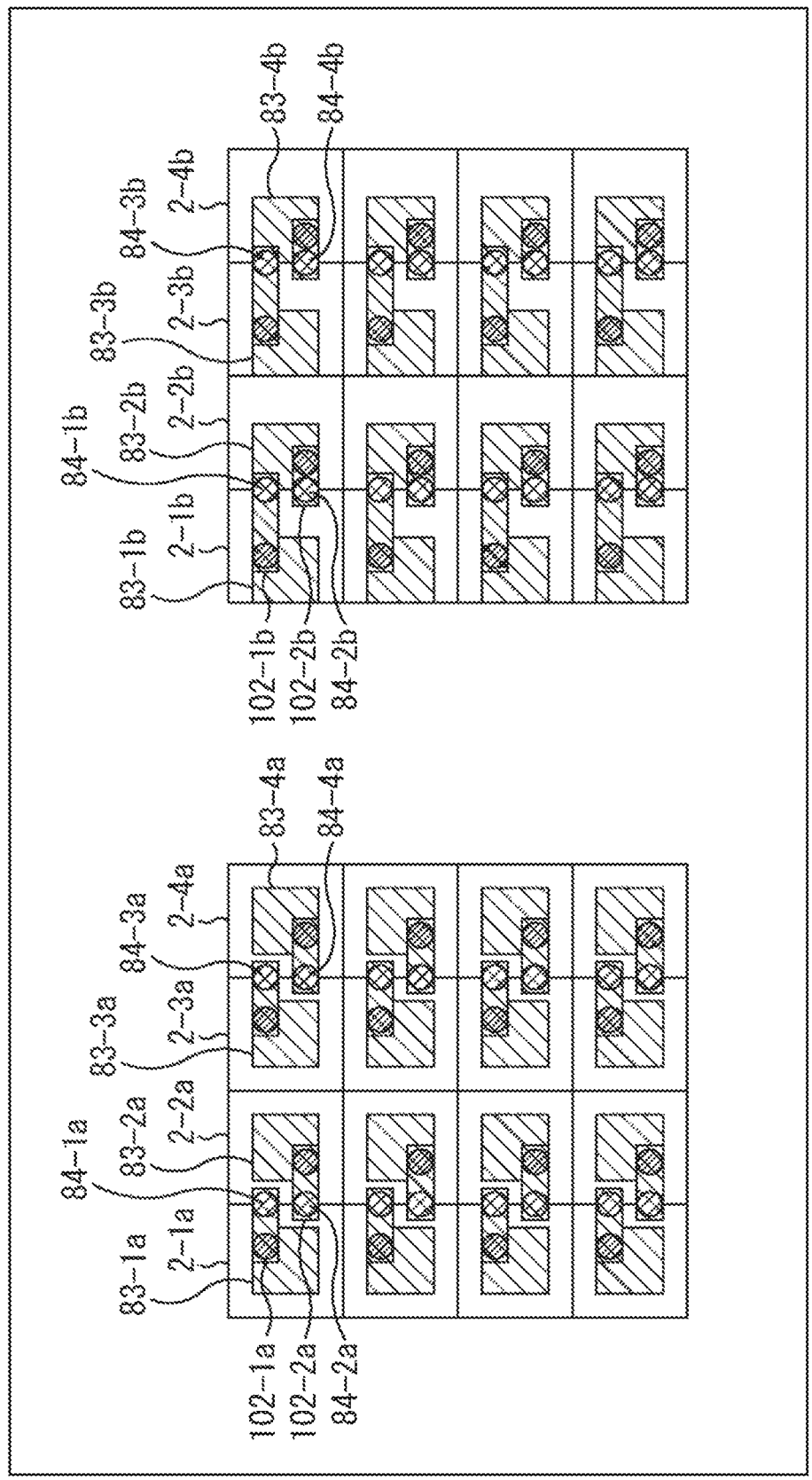
FIG. 19 is an explanatory diagram explaining how electrodes are arranged.

Referring to the left subfigure in FIG. 19, the through-hole electrodes 84-1*a* and 84-2*a*, positioning at the center of the angle of view, of the pixels 2-1*a* and 2-2*a* adjacent to each other are formed on the boundary between these pixels 2-1*a* and 2-2*a*. The through-hole electrode 84-1*a* is formed on the right of the pixel 2-1*a* (first lower electrode 83-1*a*), and the through-hole electrode 84-2*a* is formed on the left of the pixel 2-2*a* (first lower electrode 83-2*a*).

Likewise, the through-hole electrodes 84-3*a* and 84-4*a* of the pixels 2-3*a* and 2-4*a* adjacent to each other are formed on the boundary between these pixels 2-3*a* and 2-4*a*. The through-hole electrode 84-3*a* is formed on the right of the pixel 2-3*a* (first lower electrode 83-3*a*), and the through-hole electrode 84-4*a* is formed on the left of the pixel 2-4*a* (first lower electrode 83-4*a*).

The through-hole electrodes 84 at the edge of the angle of view are arranged in the same manner as at the center of the angle of view. That is, positioning at the edge of the angle of view, the through-hole electrodes 84-1*b* and 84-2*b* of the pixels 2-1*b* and 2-2*b* adjacent to each other are formed on the boundary between these pixels 2-1*b* and 2-2*b*. The through-hole electrode 84-1*b* is formed on the right of the pixel 2-1*b* (first lower electrode 83-1 (first lower electrode 83-1*b*), and the through-hole electrode 84-2*b* is formed on the left of the pixel 2-2*b* (first lower electrode 83-2*b*).

Likewise, the through-hole electrodes 84-3*b* and 84-4*b* of the pixels 2-3*b* and 2-4*b* adjacent to each other are formed on the boundary between these pixels 2-3*b* and 2-4*b*. The through-hole electrode 84-3*b* is formed on the right of the pixel 2-3*b* (first lower electrode 83-3*b*), and the through-hole electrode 84-4*b* is formed on the left of the pixel 2-4*b* (first lower electrode 83-4*b*).

As described above, the through-hole electrodes 84 of the adjacent pixels 2 may each be arranged to be formed on the boundary between the adjacent pixels.

In the case where the through-hole electrodes 84 are arranged as described above, the vias 101 are also arranged at positions with the amounts of shift corresponding to the amount of pupil correction. The second lower electrodes 102 are sized by taking into consideration of these amounts of shift.

At the center of the angle of view, the second lower electrode 102-1*a* related to the pixel 2-1*a* and the second lower electrode 102-2*a* related to the pixel 2-2*a*, for example, are formed in approximately the same size. Likewise, the second lower electrode 102-3*a* related to the pixel 2-3*a* and the second lower electrode 102-4*a* related to the pixel 2-4*a* are formed in approximately the same size.

At the edge of the angle of view, the second lower electrode 102-1*b* related to the pixel 2-1*b* and the second lower electrode 102-2*b* related to the pixel 2-2*b*, for example, are formed in different sizes. The second lower electrode 102-1*b* is formed to be larger than the second lower electrode 102-2*b*.

Also at the edge of the angle of view, the second lower electrode 102-3*b* related to the pixel 2-3*b* and the second lower electrode 102-4*b* related to the pixel 2-4*b*, for example, are formed in different sizes. The second lower electrode 102-3*b* is formed to be larger than the second lower electrode 102-4*b*.

In the case of comparison between the second lower electrode 102-1*a* formed at the center of the angle of view and the second lower electrode 102-1*b* formed at the edge of the angle of view, the second lower electrode 102-1*b* is larger than the second lower electrode 102-1*a*. Because the distance between the via 101-1*b* and the through-hole electrode 84-1*b* at the edge of the angle of view is longer than the distance between the via 101-1*a* and the through-hole electrode 84-1*a* at the center of the angle of view, the second lower electrode 102-1*b* is formed to be larger than the second lower electrode 102-1*a* by as much as the difference between the via-to-through-hole-electrode distances.

Also, in the case of comparison between the second lower electrode 102-2*a* formed at the center of the angle of view and the second lower electrode 102-2*b* formed at the edge of the angle of view, the second lower electrode 102-2*b* is smaller than the second lower electrode 102-2*a*. Because the distance between the via 101-2*b* and the through-hole electrode 84-2*b* at the edge of the angle of view is shorter than the distance between the via 101-2*a* and the through-hole electrode 84-2*a* at the center of the angle of view, the second lower electrode 102-2*b* is formed to be smaller than the second lower electrode 102-2*a* by as much as the difference between the via-to-through-hole-electrode distances.

As described above, the second lower electrode 102 is formed to be gradually larger or smaller from the center of the angle of view toward the edge of the angle of view for the purpose of pupil correction. In these formations, as in the above-described embodiments, the lenses 81, color filters 85 (or color filters 91), first lower electrodes 83, and vias 101 at the edge of the angle of view are arranged to be shifted by their respective predetermined amounts of shift. This provides the structure where oblique incident light is allowed to enter the G organic photoelectric conversion film 82 with a minimum of loss, thereby reducing the drop in sensitivity.

Examples of Application to Front-Illuminated Apparatus

The above embodiments were explained using examples of a back-illuminated imaging apparatus. However, the scope of application of the present technology is not limited to the back-illuminated imaging apparatus. Alternatively, the technology may be applied to a front-illuminated imaging apparatus such as one depicted in FIG. 20.

Figure 20:
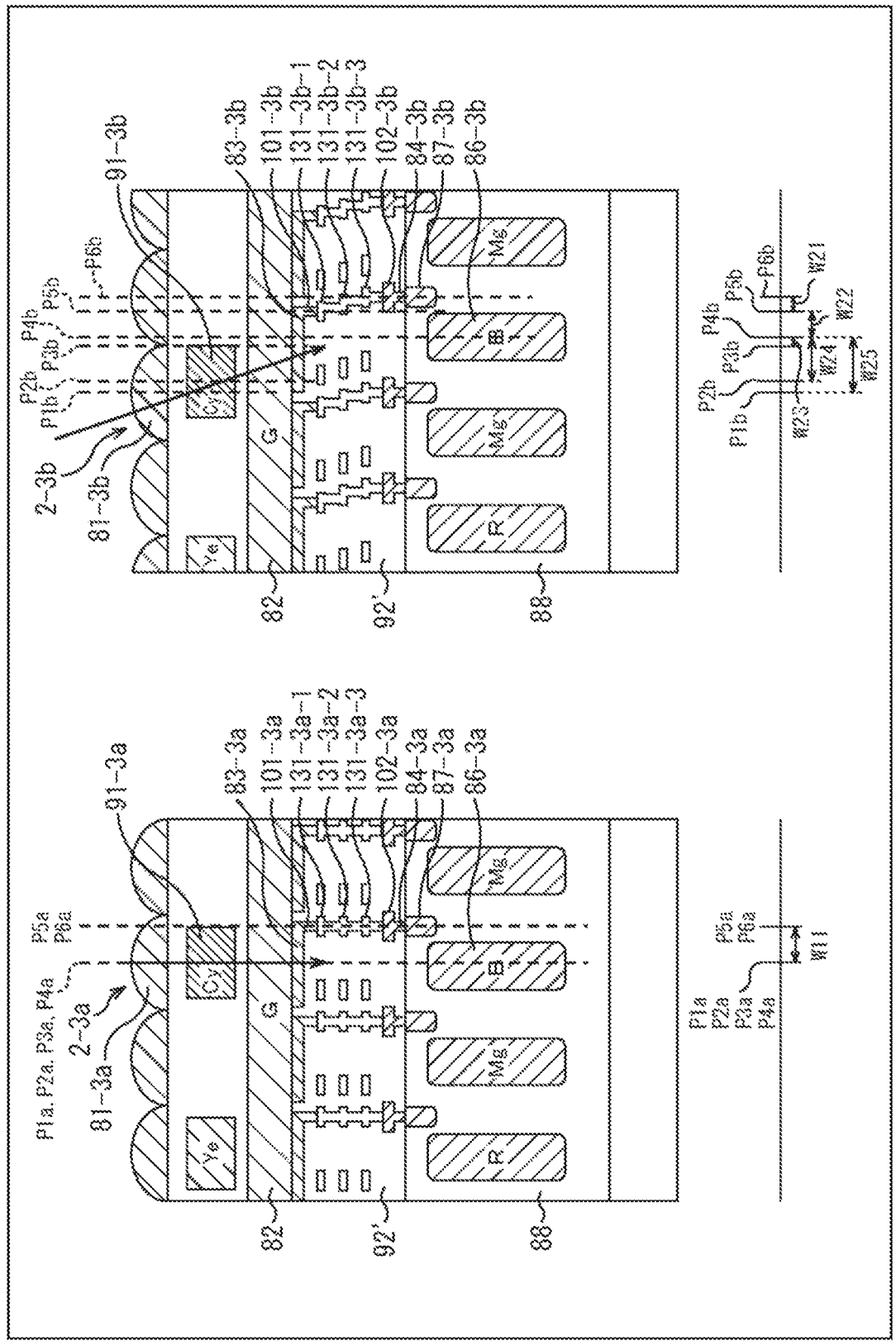
FIG. 20 is an explanatory diagram explaining the amount of pupil correction.

FIG. 20 depicts structures of an embodiment in which the present technology is applied to a front-illuminated imaging apparatus. The left subfigure in FIG. 20 depicts the structure of a pixel 2 at the center of the angle of view, and the right subfigure in FIG. 20 illustrates the structure of a pixel 2 at the edge of the angle of view. The front-illuminated imaging apparatus is different, for example, from the back-illuminated imaging apparatus depicted in FIG. 5 in that a wiring layer 92 under the silicon substrate 88 in FIG. 5 is formed as a wiring layer 92' between the G organic photoelectric conversion film 82 and the silicon substrate 88 in FIG. 20.

The pixel 2-3a, for example, positioned at the center of the angle of view is taken as an example for explanation hereunder. In the wiring layer 92' of the pixel 2-3a, wires 131-3a-1 to 131-3a-3 are formed. Whereas the explanation below proceeds on the assumption that three wires are formed, many more wires may be formed in this structure in practice. Also, in the case where there is no need to distinguish the individual wires 131-3a-1 to 131-3a-3 from one another, these wires may be generically referred to as the wire 131-3a hereunder where appropriate.

The first lower electrode 83-3a arranged under the G organic photoelectric conversion film 82 is connected with an electrode formed in the via 101-3a. Through that electrode, the first lower electrode 83-3a is connected with the wire 131-3a in the wiring layer 92'. The wire 131-3a is connected with the second lower electrode 102-3a. The second lower electrode 102-3a is connected with the electrode 84-3a. The electrode 84-3a is connected with a charge storage section 87-3a.

Incidentally, the electrode 84 corresponds to the through-hole electrode 84 in the above-described back-illuminated imaging apparatus. Because the electrode 84 is not formed as a through-hole in the front-illuminated imaging apparatus, the electrode here is simply referred to as the electrode 84.

The pixels 2 positioned at the edge of the angle of view are also formed to have the similar structure as the pixels 2 positioned at the center of the angle of view. The pixel 2-3b, for example, positioned at the edge of the angle of view is taken as an example for explanation hereunder. The first lower electrode 83-3b arranged under the G organic photoelectric conversion film 82 is connected with an electrode formed in the via 101-3b. Through that electrode, the first lower electrode 83-3b is connected with the wire 131-3b in the wiring layer 92'. The wire 131-3b is connected with the second lower electrode 102-3b. The second lower electrode 102-3b is connected with the electrode 84-3b. The electrode 84-3b is connected with a charge storage section 87-3b.

The center line position of the lens 81-3a in, for example, the pixel 2-3a positioned at the center of the angle of view is referred to as the position P1a, the center line position of the Cy color filter 91-3a as the position P2a, the center line position of the first lower electrode 83-3a as the position P3a, and the center line position of the photodiode 86-3a (pixel) as the position P4a hereunder. Also, the center line position of the via 101-3a is referred to as the position P5a and the center line position of the electrode 84-3a as the position P6a hereunder.

At the center of the angle of view, the center line position P1a of the lens 81-3a, the center line position P2a of the Cy color filter 91-3a, the center line position P3a of the first lower electrode 83-3a, and the center line position P4a of the photodiode 86 are the same position. Thus the center line positions P1a, P2a, P3a, and P4a satisfy the relation of P1a=P2a=P3a=P4a. Also, the center line position P5a of the via 101-3a and the center line position P6a of the electrode 84-3a are the same position, so that the center line positions P5a and P6a satisfy the relation of P5a=P6a.

Because the center line position P5a of the via 101-3a and the center line position P6a of the electrode 84-3a are the same position, the multiple wires 131-3a-1 to 131-3a-3 arranged longitudinally in the wiring layer 92' between the via 101-3a and the electrode 84-3a are arranged (formed) linearly in the longitudinal direction.

In the pixel 2-3b at the edge of the angle of view, the center line position of the lens 81-3b is referred to as the position P1b, the center line position of the Cy color filter 91-3b as the position P2b, the center line position of the first lower electrode 83-3b as the position P3b, and the center line position of the photodiode 86-3b (pixel) as the position P4b hereunder. Also, the center line position of the via 101-3b is referred to as the position P5b and the center line position of the electrode 84-3b as the position P6b hereunder.

At the edge of the angle of view, the center line position P1b of the lens 81-3b, the center line position P2b of the Cy color filter 91-3b, the center line position P3b of the first lower electrode 83-3b, and the center line position P4b of the photodiode 86 are different positions. Also, the center line position P5b of the via 101-3b and the center line position P6b of the electrode 84-3b are different positions.

In the pixel 2-3b positioned at the edge of the angle of view, the first lower electrode 83-3b is arranged at a position shifted from the photodiode 86-3b by the distance W23. Also in the pixel 2-3b, the Cy color filter 91-3b is arranged at a position shifted from the photodiode 86-3b by the distance W24. Further in the pixel 2-3b, the lens 81-3b is arranged at a position shifted from the photodiode 86-3b by the distance W25.

As described above, the first lower electrode 83-3b, Cy color filter 91-3b, and lens 81-3b are each arranged at positions shifted from the photodiode 86-3b by predetermined distances. Also, the first lower electrode 83-3b, Cy color filter 91-3b, and lens 81-3b are arranged in such a manner that the distances W23, W24, and W25 satisfy the relation of W25>W24>W23.

When the first lower electrodes 83, Cy color filters 91, and lenses 81 at the edge of the angle of view are arranged at positions shifted from the photodiodes 86 as explained above, pupil correction is carried out.

Also according to the present technology, the vias 101 are each arranged at a position shifted from the photodiode 86 by the amount of shift reflecting the amounts of shift of the first lower electrodes 83, color filters 91, and lenses 81. In the example depicted in FIG. 20, the via 101-3b is arranged at a position shifted from the photodiode 86-3b by the distance W22.

The distance between the photodiode 86 and the electrode 84 at the center of the angle of view is the distance W11, the same as at the edge of the angle of view. Thus at the center of the angle of view, as described above, the photodiode 86-3a and the via 101-3a are arranged at positions the distance W11 apart from each other. At the edge of the angle of view, by contrast, the photodiode 86-3b and the via 101-3b are arranged at positions the distance W22 apart from each other. The distances W11 and W22 satisfy the relation of W11>W22.

Also at the edge of the angle of view, the via 101-3b and the electrode 84-3b are arranged at positions the distance W21 apart from each other. The distance W21, the distance W22 between the photodiode 86-3b and the via 101-3b, and the distance W11 between the photodiode 86-3b and the electrode 84-3b have the relation of W11=W21+W22.

The distance W21 or W22 is a distance that reflects the amounts of shift for the pupil correction of the first lower electrodes 83, color filters 91, and lenses 81 (i.e., amounts of pupil correction). When the relation between the photodiode 86 and the via 101 is considered, the distance therebetween varies gradually from the distance W11 to the distance W22 from the center of the angle of view toward the edge of the angle of view. In this case, the distances W11 and W22 have the relation of W11>W22, so that the distance between the photodiode 86 and the via 101 is gradually shortened from the center of the angle of view toward the edge of the angle of view.

Also, when the relation between the via 101 and the electrode 84 is considered, the distance therebetween varies gradually from 0 to the distance W21 from the center of the angle of view toward the edge of the angle of view. In this case, the distance W21 is greater than 0, so that the distance between the via 101 and electrode 84 is gradually increased from the center of the angle of view toward the edge of the angle of view.

As described above, with the structure in which the via 101-3b and the electrode 84-3b are arranged at shifted positions at the edge of the angle of view, pupil correction is carried out. Because the via 101-3b and the electrode 84-3b are arranged at shifted positions, the multiple wires 131-3b-1 to 131-3b-3 arrayed longitudinally in the wiring layer 92' between the via 101-3b and the electrode 84-3b are arranged at positions shifted longitudinally from one another in such a manner as to absorb the amounts of shift.

In the example depicted in FIG. 20, the wire 131-3b-1 is arranged at a position in contact with the via 101-3b; the wire 131-3b-2 is arranged at a position shifted to the right of the wire 131-3b-1 as seen in the drawing; and the wire 131-3b-3 is arranged at a position shifted to the right of the wire 131-3b-2 as viewed in the drawing. Further, the wire 131-3b-3 is connected with the second lower electrode 102-3b that in turn is connected with the electrode 84-3b.

At the edge of the angle of view, as described above, the wires 131 in the wiring layer 92' are arranged in a manner staggered from each other, with amounts of shift provided to reflect the amounts of pupil correction. These wires are arranged to be connected with the upper and lower electrodes inside the wiring layer 92'. In other words, these multiple wires 131 are arranged in the wiring layer 92' in a manner positionally shifted from each other to absorb the amount of shift of the via 101-3b from the electrode 84-3b.

Explained below is what is related to the amount of shift of the photodiode 86-3 positioned at the edge of the angle of view. The distance W21 between the electrode 84-3b and the via 101-3b is shorter than the distance W24 between the Cy color filter 91-3b and the photodiode 86-3b. That is, the distances W21 and W24 satisfy the relation of W21<W24. Specifically, as amount of pupil correction, the amount of shift of the Cy color filter 91-3b from the photodiode 86-3b for pupil correction is larger than the amount of shift of the via 101-3b from the through-hole electrode 84-3b.

Also, the lens 81-3b is shifted further from the photodiode 86-3b than from the Cy color filter 91-3b. For this reason, as amount of pupil correction, the amount of shift of the lens 81-3b from the photodiode 86-3b for pupil correction is larger than the amount of shift of the via 101-3b from the through-hole electrode 84-3b.

As described above, the lenses 81, color filters 91, first lower electrodes 83, vias 101, and wires 131 at the edge of the angle of view are arranged to be shifted by their respective predetermined amounts of shift. This provides the structure where oblique incident light is allowed to enter the G organic photoelectric conversion film 82 with a minimum of loss, thereby reducing the drop in sensitivity.

In the front-illuminated apparatus, the wiring layer 92' is interposed between the G organic photoelectric conversion film 82 and the silicon layer 88, so that it is necessary to provide a larger amount of pupil correction. As described above, when pupil correction is also performed on the wires 131 inside the wiring layer 92', the signals are conveyed into the unit pixels even in the case where there is a large amount of pupil correction on the lower electrodes.

Incidentally, the electrodes such as the first lower electrodes 83, electrodes formed in the vias 101, second lower electrodes 102, and through-hole electrodes 84 (electrodes 84) in the above-described embodiments may each be formed using any of such materials as ITO, SnO2 of the tin oxide group, aluminum-doped zinc oxide of a zinc oxide material, gallium-doped zinc oxide, indium-doped zinc oxide, IZGO, CuI, InSbO4, ZnMgO, CuInO2, MgIn2O4, CdO, and ZnSnO3.

Also in the above-described embodiments, the organic photoelectric conversion film 82 may be formed using any of such materials as quinacridone derivatives, naphthalene derivatives, anthracene derivatives, phenanthrene derivatives, tetracene derivatives, pyrene derivatives, perylene derivatives, or fluoranthene derivatives.

Further in the above-described embodiments, the organic photoelectric conversion film 82 may be formed using any of such materials as the polymers or derivatives of phenylenevinylene, fluorene, carbazole, indole, pyrene, pyrrole, picoline, thiophene, acetylene, and diacetylene; condensed polycyclic aromatics such as metal complex dyes, cyanine-based dyes, merocyanine-based dyes, phenyl xanthene-based dyes, triphenylmethane-based dyes, rhodacyanine-based dyes, xanthene-based dyes, macrocyclic azaannulene-based dyes, azulene-based dyes, naphthoquinone, anthraquinone-based dyes, anthracene, and pyrene; chain compounds obtained by condensing aromatic ring compounds or heterocyclic compounds; two nitrogen-containing heterocycles such as quinoline, benzothiazole, and benzoxazole having the squarylium group and croconic methine group as joining chains; or cyanine-like dyes joined by benzoxazole having the squarylium group and croconic methine group. Further, the metal complex dye may be any of metal dithiolene complex dyes, metal phthalocyanine dyes, metal porphyrin dyes, or ruthenium complex dyes.

Structures of Camera Modules

The present technology is not limited to being applied to imaging apparatuses. That is, the present technology can be applied not only to imaging apparatuses but also to camera modules having optical lens systems, imaging apparatuses such as a digital still camera or a video camera, portable terminal apparatuses having an imaging function (e.g., smartphones and tablet terminals), copiers that use an imaging apparatus in their image readout section, or any other electronic device having an imaging apparatus.

Figure 21:
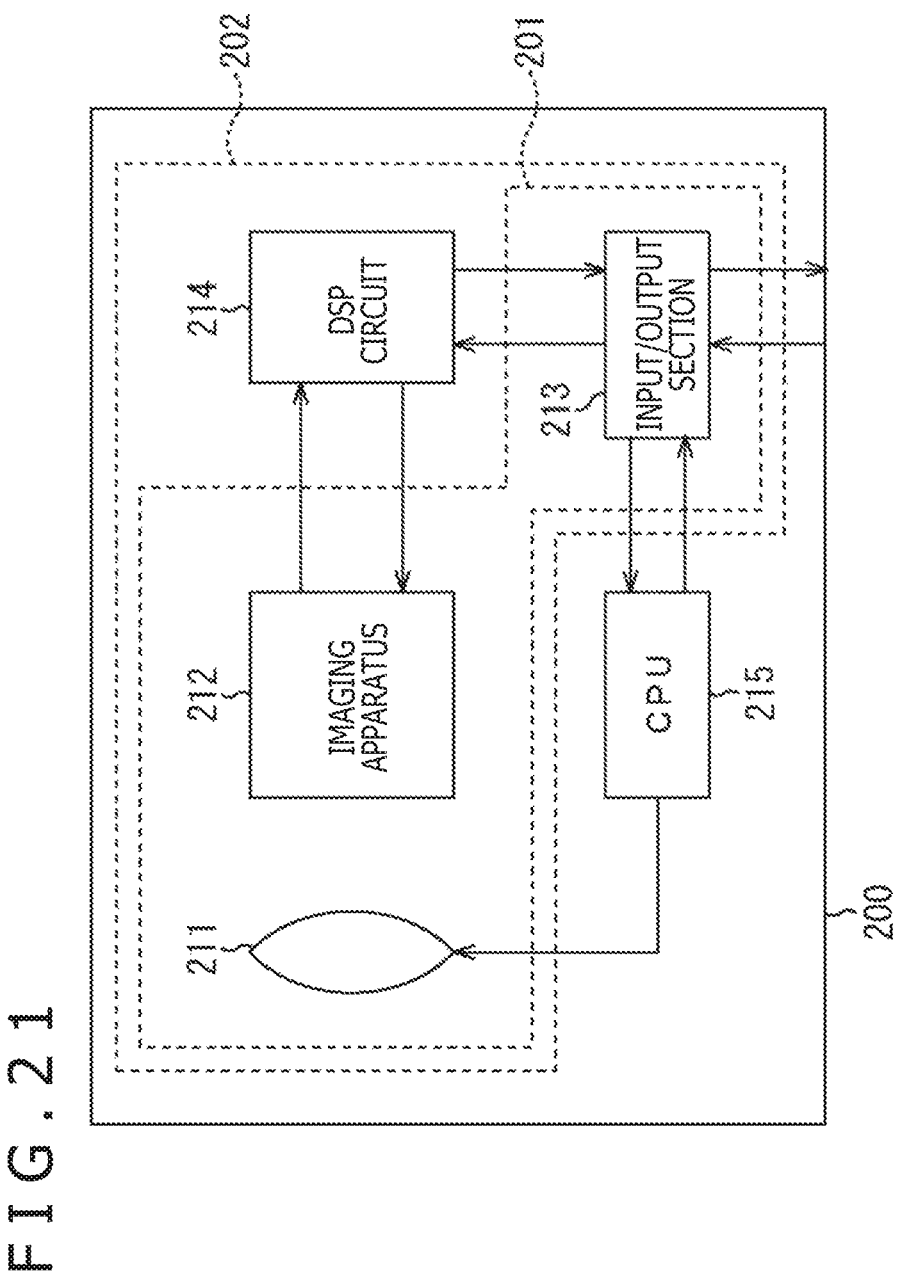
FIG. 21 is an explanatory diagram explaining a structure of a camera module.

FIG. 21 depicts a typical structure of a camera module that includes an imaging apparatus.

In FIG. 21, a camera module 200 is structured as a single module that incorporates an optical lens system 211, an imaging apparatus 212, an input/output section 213, a digital signal processor (DSP) circuit 214, and a CPU 215.

The imaging apparatus 212 corresponds to the imaging apparatus 1 in FIG. 1. The imaging apparatus 212 is structured in such a manner that the cross-sectional structure adopted thereby is similar to what is depicted in FIG. 5, for example. The imaging apparatus 212 receives incident light (image light) from a target object through the optical lens system 211, causes the amount of incident light formed as an image on the imaging plane to be converted into electrical signals in increments of pixels, and outputs the electrical signals as pixel signals. The input/output section 213 functions as an input/output interface interfacing with the outside.

The DSP circuit 214 is a signal processing circuit that processes the signals supplied from the imaging apparatus 212. For example, the signal processing circuit processes RGB signals corresponding to the signals reflecting the green (G) and red (R) components output from the pixels 2-1 (FIG. 3) and to the signals reflecting the green (G) and blue (B) components output from the pixels 2-3 (FIG. 3).

Also, given the output from the pixels 2-2 (FIG. 3), the signal processing circuit obtains the signals corresponding to the green (G) and magenta (Mg) components. The signal processing circuit then obtains the W signal by combining these signals. Likewise, given the output from the pixels 2-4 (FIG. 3), the signal processing circuit obtains the signals corresponding to the green (G) and magenta (Mg) components. The signal processing circuit thus obtains the W signal by combining these signals. Alternatively, the above-described processing performed by the signal processing circuit may be carried out by the imaging apparatus 212.

The CPU 215 controls the optical lens system 211 and exchanges data with the input/output section 213, for example.

Also, a camera module 201 may be constituted using solely the optical lens system 211, imaging apparatus 212, and input/output section 213, for example. In this case, the pixel signals from the imaging apparatus 212 are output through the input/output section 213. As another alternative, a camera module 202 may be constituted using the optical lens system 211, imaging apparatus 212, input/output section 213, and DSP circuit 214. In this case, the pixel signals from the imaging apparatus 212 are processed by the DSP circuit 214 and output through the input/output section 213.

The camera modules 200, 201 and 202 are structured as described above. The camera modules 200, 201 and 202 are each structured using the imaging apparatus 212 having the pixels (e.g., pixel 2-2 and 2-4 in FIG. 3) designed for improved sensitivity. This structure makes it possible to obtain the W signal in addition to the RGB signals. Using the W signal achieves higher resolution while improving sensitivity. With pupil correction also carried out appropriately, it is possible to improve image quality as well.

Structure of the Electronic Device

Figure 22:
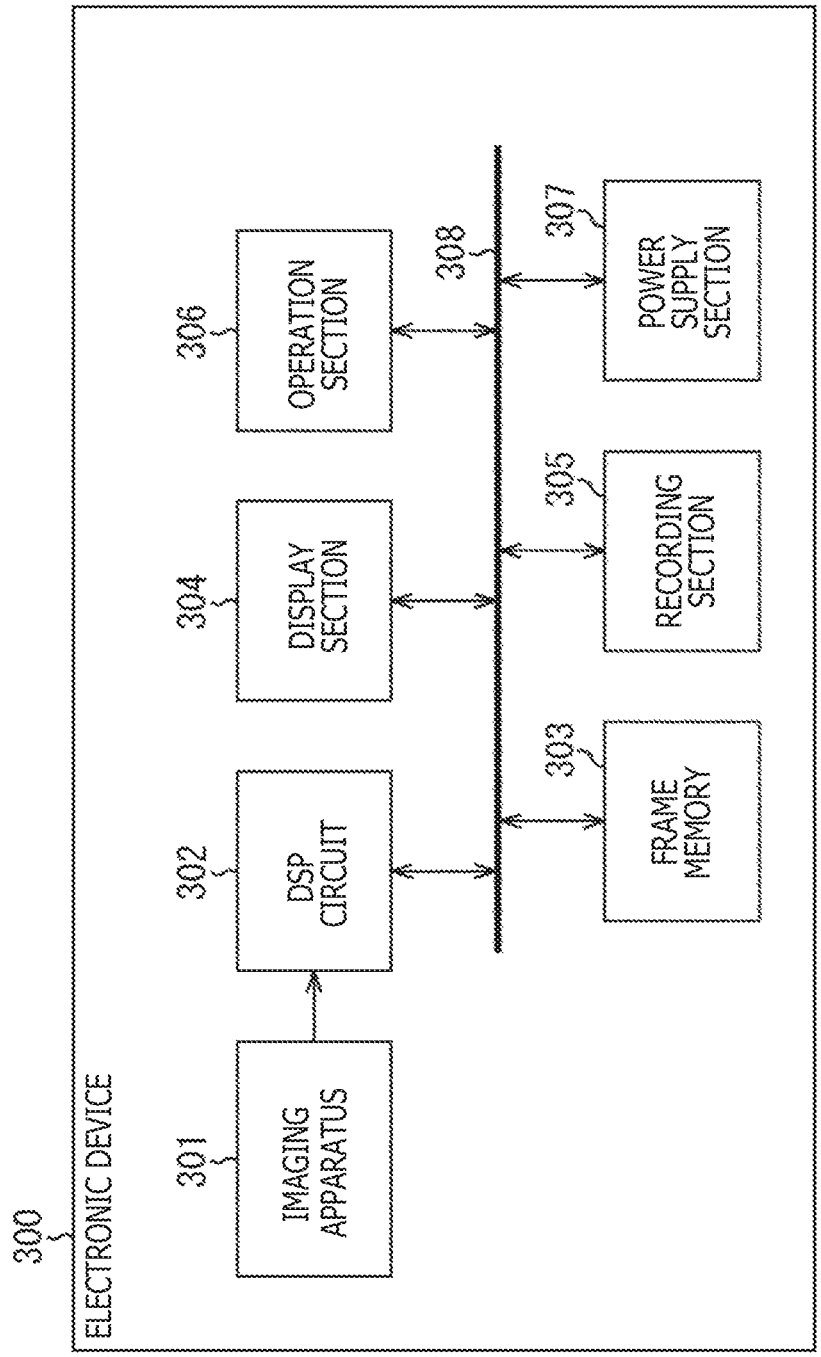
FIG. 22 is a schematic diagram depicting a typical structure of an electronic device.

FIG. 22 depicts a typical structure of an electronic device that includes an imaging apparatus.

For example, an electronic device 300 in FIG. 22 is an imaging apparatus such as a digital still camera or a video camera, or a mobile terminal apparatus such as a smartphone or a tablet terminal.

In FIG. 22, the electronic device 300 includes an imaging apparatus 301, a DSP circuit 302, a frame memory 303, a display section 304, a recording section 305, an operation section 306, and a power supply section 307. Also in the electronic device 300, the DSP circuit 302, frame memory 303, display section 304, recording section 305, operation section 306, and power supply section 307 are interconnected through a bus line 308.

The imaging apparatus 301 corresponds to the imaging apparatus 1 in FIG. 1. The imaging apparatus 300 is structured in such a manner that the cross-sectional structure adopted thereby is similar to what is depicted in FIG. 3, for example. That is, the imaging apparatus 212 includes the pixels (e.g., pixels 2-2 and 2-4 in FIG. 3) designed for improved sensitivity. The imaging apparatus 301 receives incident light (image light) from a target object through an optical lens system (not depicted), causes the amount of incident light formed as an image on the imaging plane to be converted into electrical signals in increments of pixels, and outputs the electrical signals as pixel signals.

The DSP circuit 302 is a signal processing circuit that processes signals supplied from the imaging apparatus 301. The DSP circuit 302 corresponds to the DSP circuit 214 in FIG. 21. The DSP circuit 302 outputs the image data obtained by processing the signals from the imaging apparatus 301. The frame memory 303 temporarily holds, in increments of frames, the image data processed by the DSP circuit 302.

The display section 304 is, for example, a panel-type display apparatus such as a liquid crystal display panel or an organic electroluminescence (EL) panel. The display section 304 displays moving or still images captured by the imaging apparatus 301. The recording section 305 records the image data of the moving or still images captured by the imaging apparatus 301 to a recording medium such as a semiconductor memory or a hard disk.

The operation section 306 outputs operational commands regarding various functions provided by the electronic device 300 in accordance with operations performed by a user. As needed, the power supply section 307 provides various power supplies serving as the operating power of the DSP circuit 302, frame memory 303, display section 304, recording section 305, and operation section 306.

The electronic device 300 is structured as outlined above. Because the electronic device 300 includes the imaging apparatus 212 furnished with the pixels designed for improved sensitivity (e.g., pixels 2-2 and 2-4 in FIG. 3), the electronic device 300 obtains the W signal in addition to the RGB signals. Using the W signal allows the electronic device 300 to provide higher resolution while improving sensitivity. With pupil correction also carried out appropriately, it is possible to improve image quality as well.

Use Examples of the Imaging Apparatus

Figure 23:
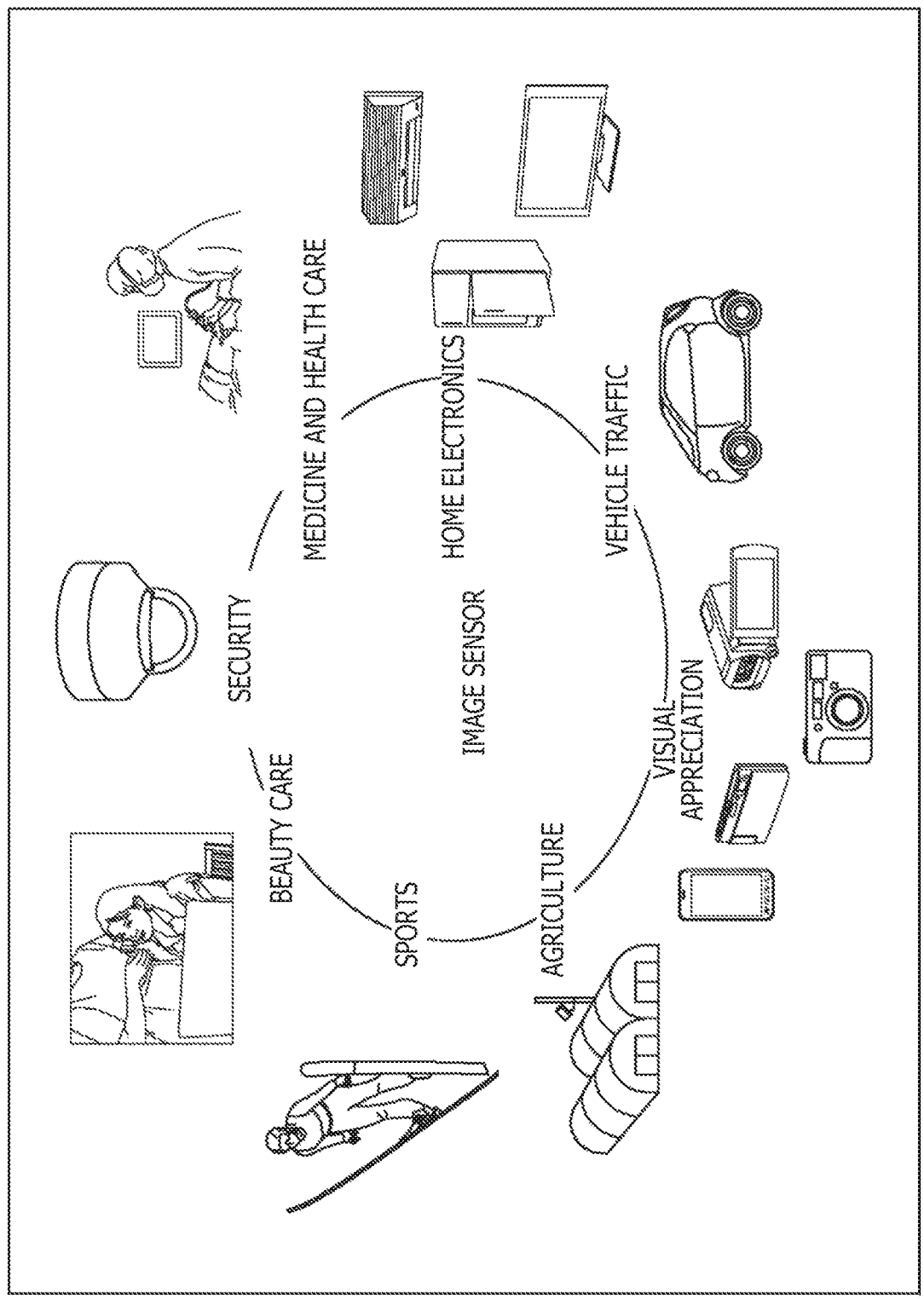
FIG. 23 is an explanatory diagram explaining use examples of the imaging apparatus.

FIG. 23 depicts some use examples of the imaging apparatus 1 acting as an image sensor.

The imaging apparatus 1 described above may be used in various cases outlined below, such as where diverse types of light including visible light, infrared light, ultraviolet radiation, or X-radiation are sensed. That is, as depicted in FIG. 23, the imaging apparatus 1 may be used in conjunction with not only devices that capture images for use in visual appreciation in the field of visual appreciation as discussed above, but also devices for use in the field of vehicle traffic, appliances in the field of home electronics, devices in the field of medicine and health care, devices in the field of security, devices in the field of beauty care, devices in the field of sports, and devices in the field of agriculture, for example.

More specifically, the imaging apparatus 1 may be used in conjunction with the above-mentioned devices that capture images for use in visual appreciation (e.g., electronic device 300 in FIG. 22), such as digital cameras, smartphones, and camera function-equipped mobile phones in the field of visual appreciation.

As another example, the imaging apparatus 1 may be used in conjunction with the devices for use in the field of vehicle traffic, including onboard sensors that capture images of the front side, rear side, surroundings, and interior of a vehicle to ensure safe operations such as automated vehicle stop and to recognize the driver's status; surveillance cameras for monitoring passing vehicles and the roads on which they travel; and distance measurement sensors for measuring the distance between vehicles.

As another example, the imaging apparatus 1 may be used in conjunction with the devices that capture images of users' gestures to operate home electric appliances such as TV sets, refrigerators, and air conditioners in a manner reflecting the gestures in the field of home electronics. The imaging apparatus 1 may also be used in conjunction with the devices for use in the field medicine and health care, such as endoscopes and instruments that capture images of blood vessels using received infrared radiation.

As another example, the imaging apparatus 1 may be used in conjunction with the devices for use in the field of security, such as surveillance cameras for crime prevention and cameras for personal authentication. The imaging apparatus 1 may also be used in conjunction with the devices for use in the field of beauty care, such as skin measuring instruments and microscopes for capturing images of the scalp.

As another example, the imaging apparatus 1 may be used in conjunction with the devices for use in the field of sports, such as action cameras and wearable cameras. The imaging apparatus 1 may also be used in conjunction with the devices for use in the field of agriculture, such as surveillance cameras for monitoring fields and crops.

It is to be noted that the present technology is not limited to the above-described embodiments that may be varied or modified diversely within the spirit and scope of the present technology. For example, part or all of the multiple embodiments discussed above may be combined to devise other embodiments.

Further, the present technology may be structured preferably as follows:

(1)

An imaging apparatus including:

a photoelectric conversion film configured to absorb light of a predetermined color component to generate signal charges;

a first lower electrode configured to be formed under the photoelectric conversion film;

a second lower electrode configured to be connected with the first lower electrode;

a via configured to connect the first lower electrode with the second lower electrode; and a photodiode configured to be formed under the second lower electrode and to generate signal charges reflecting the amount of incident light, in which a first distance between the center of the photodiode and the center of the via at the center of the angle of view is different from a second distance between the center of the photodiode and the center of the via at an edge of the angle of view.

(2)

The imaging apparatus as stated in paragraph (1) above, in which a first size of the second lower electrode at the center of the angle of view is different from a second size of the second lower electrode at the edge of the angle of view.

(3)

The imaging apparatus as stated in paragraph (2) above, in which the difference between the first size and the second size corresponds to the difference between the first distance and the second distance.

(4)

The imaging apparatus as stated in paragraph (1) above, in which the size of the second lower electrode corresponds to the distance between the center of the via and the center of a through-hole electrode connected with the second lower electrode at the edge of the angle of view.

(5)

The imaging apparatus as stated in any one of paragraphs (1) to (4) above, in which the position of the center of the first lower electrode approximately coincides with the center of the photodiode at the center of the angle of view, and is shifted from the position of the center of the photodiode by a predetermined amount of shift at the edge of the angle of view.

(6)

The imaging apparatus as stated in any one of paragraphs (1) to (5) above, further including a color filter over the photoelectric conversion film, in which the position of the center of the color filter approximately coincides with the center of the photodiode at the center of the angle of view, and is shifted from the position of the center of the photodiode by a first amount of shift at the edge of the angle of view, and the first amount of shift is larger than the difference between the first distance and the second distance.

(7)

The imaging apparatus as stated in any one of paragraphs (1) to (5) above, further including a color filter under the photoelectric conversion film, in which the position of the center of the color filter approximately coincides with the center of the photodiode at the center of the angle of view, and is shifted from the position of the center of the photodiode by a first amount of shift at the edge of the angle of view, and the first amount of shift is larger than the difference between the first distance and the second distance.

(8)

The imaging apparatus as stated in any one of paragraphs (1) to (7) above, further including a lens over the photoelectric conversion film, in which the position of the center of the lens approximately coincides with the center of the photodiode at the center of the angle of view, and is shifted from the position of the center of the photodiode by a second amount of shift at the edge of the angle of view, and the second amount of shift is larger than the difference between the first distance and the second distance.

(9)

The imaging apparatus as stated in any one of paragraphs (1) to (8) above, in which the first lower electrode is configured to have a slit, and the slit is arranged at a position shifted from the position of the center of the photodiode.

(10)

The imaging apparatus as stated in paragraph (9) above, in which a pixel having the slit in the first lower electrode functions as a pixel for phase difference detection.

(11)

The imaging apparatus as stated in any one of paragraphs (1) to (10) above, in which the second lower electrode is arranged in a boundary region between pixels.

(12)

The imaging apparatus as stated in any one of paragraphs (1) to (11) above, in which the first lower electrode and the second lower electrode are configured to be transparent electrodes.

(13)

The imaging apparatus as stated in paragraph (1) above, in which the imaging apparatus is configured to be a front-illuminated imaging apparatus, a wiring layer is provided between the first lower electrode and the second lower electrode, and wires inside the wiring layer are arranged in a manner gradually shifted from one another by an amount reflecting the amount of shift between the center of the via and the center of a through-hole electrode connected with the second lower electrode.

(14)

The imaging apparatus as stated in any one of paragraphs (1) to (13) above, further including a pixel array section including a plurality of two-dimensionally arrayed pixels each having the photoelectric conversion film and the photodiode, in which the pixel array section has a two-dimensional array of the multiple pixels in a combination including a first pixel configured to perform photoelectric conversion of a first color component using the photoelectric conversion film, the first pixel further using the photodiode to perform photoelectric conversion of a third color component having passed through both a first color filter letting a second color component pass through and the photoelectric conversion film, a second pixel configured to perform photoelectric conversion of the first color component using the photoelectric conversion film, the second pixel further using the photodiode to perform photoelectric conversion of a fifth color component having passed through both a second color filter letting a fourth color component pass through and the photoelectric conversion film, and a third pixel configured to perform photoelectric conversion of the first color component using the photoelectric conversion film, the third pixel further using the photodiode to perform photoelectric conversion of a sixth color component having passed through the photoelectric conversion film, and the first color component is mixed with the sixth color component to provide a white (W) component.

(15)

The imaging apparatus as stated in paragraph (14) above, in which the first color filter and the second color filter are arranged under the photoelectric conversion film relative to a light incident side, the first color component is green (G),
the second color component is red (R),
the third color component is red (R),
the fourth color component is blue (B),
the fifth color component is blue (B), and
the sixth color component is magenta (Mg).

(16)

The imaging apparatus as stated in paragraph (14) above, in which the first color filter and the second color filter are arranged over the photoelectric conversion film relative to a light incident side, the first color component is green (G),
the second color component is yellow (Ye),
the third color component is red (R),
the fourth color component is cyan (Cy),
the fifth color component is blue (B), and
the sixth color component is magenta (Mg).

(17)

An electronic device including an imaging apparatus including a photoelectric conversion film configured to absorb light of a predetermined color component to generate signal charges, a first lower electrode configured to be formed under the photoelectric conversion film, a second lower electrode configured to be connected with the first lower electrode, a via configured to connect the first lower electrode with the second lower electrode, and a photodiode configured to be formed under the second lower electrode and to generate signal charges of second color component reflecting the amount of incident light, in which a first distance between the center of the photodiode and the center of the via at the center of the angle of view is different from a second distance between the center of the photodiode and the center of the via at an edge of the angle of view.

REFERENCE SIGNS LIST

1: Imaging apparatus
2: Pixel
3: Pixel section
4: Vertical drive circuit
5: Column signal processing circuit
6: Horizontal drive circuit
7: Output circuit
8: Control circuit
81: Lens
82: G organic photoelectric conversion film
83: Transparent electrode
84: Electrode
85-1: R color filter
85-3: B color filter
86: Photodiode
87: Charge storage section
88: Silicon layer
91-1: Ye color filter
91-3: Cy color filter

What is claimed is:

1. An imaging apparatus comprising:
a photoelectric conversion film configured to absorb light of a predetermined color component to generate signal charges;
a first lower electrode configured to be formed under the photoelectric conversion film;
a second lower electrode configured to be connected with the first lower electrode;
a via configured to connect the first lower electrode with the second lower electrode;
a through-hole electrode connected to the second lower electrode, wherein the through-hole electrode is arranged in a pixel boundary portion; and
a photodiode formed under the second lower electrode and configured to generate signal charges reflecting an amount of incident light,
wherein a first distance between a center of the photodiode and a center of the via at a center of an angle of view is different from a second distance between the center of the photodiode and the center of the via at an edge of the angle of view.

2. The imaging apparatus according to claim 1, wherein a first size of the second lower electrode at the center of the angle of view is different from a second size of the second lower electrode at the edge of the angle of view.

3. The imaging apparatus according to claim 2, wherein the difference between the first size and the second size corresponds to a difference between the first distance and the second distance.

4. The imaging apparatus according to claim 1, wherein a size of the second lower electrode corresponds to a distance between the center of the via and the center of the through-hole electrode connected with the second lower electrode at the edge of the angle of view.

5. The imaging apparatus according to claim 1, wherein a position of the center of the first lower electrode approximately coincides with the center of the photodiode at the center of the angle of view, and is shifted from a position of the center of the photodiode by a predetermined amount of shift at the edge of the angle of view.

6. The imaging apparatus according to claim 1, further comprising a color filter over the photoelectric conversion film,
wherein a position of a center of the color filter approximately coincides with the center of the photodiode at the center of the angle of view, and is shifted from a position of the center of the photodiode by a first amount of shift at the edge of the angle of view, and the first amount of shift is larger than a difference between the first distance and the second distance.

7. The imaging apparatus according to claim 1, further comprising a color filter under the photoelectric conversion film,
wherein a position of a center of the color filter approximately coincides with the center of the photodiode at the center of the angle of view, and is shifted from a position of the center of the photodiode by a first amount of shift at the edge of the angle of view, and the first amount of shift is larger than a difference between the first distance and the second distance.

8. The imaging apparatus according to claim 1, further comprising a lens over the photoelectric conversion film,
wherein a position of a center of the lens approximately coincides with the center of the photodiode at the center of the angle of view, and is shifted from a position of the center of the photodiode by a first amount of shift at the edge of the angle of view, and
the first amount of shift is larger than a difference between the first distance and the second distance.

9. The imaging apparatus according to claim 1, wherein the first lower electrode is configured to have a slit, and
the slit is arranged at a position shifted from a position of the center of the photodiode.

10. The imaging apparatus according to claim 9, wherein a pixel having the slit in the first lower electrode functions as a pixel for phase difference detection.

11. The imaging apparatus according to claim 1, wherein the second lower electrode is arranged in the pixel boundary region.

12. The imaging apparatus according to claim 1, wherein the first lower electrode and the second lower electrode are configured to be transparent electrodes.

13. The imaging apparatus according to claim 1, wherein the imaging apparatus is configured to be a front-illuminated imaging apparatus,
a wiring layer is provided between the first lower electrode and the second lower electrode, and
wires inside the wiring layer are arranged in a manner gradually shifted from one another by an amount reflecting an amount of shift between the center of the via and a center of the through-hole electrode connected with the second lower electrode.

14. The imaging apparatus according to claim 1, further comprising a pixel array section including a plurality of two-dimensionally arrayed pixels each having the photoelectric conversion film and the photodiode,
wherein the pixel array section has a two-dimensional array of pixels in a combination including
a first pixel configured to perform photoelectric conversion of a first color component using the photoelectric conversion film, the first pixel further using the photodiode to perform photoelectric conversion of a third color component having passed through both a first color filter letting a second color component pass through and the photoelectric conversion film,
a second pixel configured to perform photoelectric conversion of the first color component using the photoelectric conversion film, the second pixel further using the photodiode to perform photoelectric conversion of a fifth color component having passed through both a second color filter letting a fourth color component pass through and the photoelectric conversion film, and
a third pixel configured to perform photoelectric conversion of the first color component using the photoelectric conversion film, the third pixel further using the photodiode to perform photoelectric conversion of a sixth color component having passed through the photoelectric conversion film, and
the first color component is mixed with the sixth color component to provide a white (W) component.

15. The imaging apparatus according to claim 14, wherein the first color filter and the second color filter are arranged under the photoelectric conversion film relative to a light incident side,
the first color component is green (G),
the second color component is red (R),
the third color component is red (R),
the fourth color component is blue (B),
the fifth color component is blue (B), and
the sixth color component is magenta (Mg).

16. The imaging apparatus according to claim 14, wherein the first color filter and the second color filter are arranged over the photoelectric conversion film relative to a light incident side,
the first color component is green (G),
the second color component is yellow (Ye),
the third color component is red (R),
the fourth color component is cyan (Cy),
the fifth color component is blue (B), and
the sixth color component is magenta (Mg).

17. An electronic device comprising an imaging apparatus including
a photoelectric conversion film configured to absorb light of a predetermined color component to generate signal charges,
a first lower electrode configured to be formed under the photoelectric conversion film,
a second lower electrode configured to be connected with the first lower electrode,
a via configured to connect the first lower electrode with the second lower electrode,
a through-hole electrode connected to the second electrode, wherein the through-hole electrode is arranged in a pixel boundary portion; and
a photodiode formed under the second lower electrode and configured to generate signal charges of second color component reflecting an amount of incident light,
wherein a first distance between a center of the photodiode and a center of the via at a center of an angle of view is different from a second distance between the center of the photodiode and the center of the via at an edge of the angle of view.

* * * * *